(12) United States Patent
Yoo et al.

(10) Patent No.: US 12,302,738 B2
(45) Date of Patent: May 13, 2025

(54) BONDING DEVICE AND METHOD OF MANUFACTURING DISPLAY DEVICE USING THE SAME

(71) Applicant: Samsung Display Co., Ltd., Yongin-si (KR)

(72) Inventors: Kisang Yoo, Asan-si (KR); Kyungrok Ko, Suwon-si (KR); Youngsu Kim, Gunpo-si (KR); Jaesuk Yoo, Seoul (KR); Jeong-Seop Choi, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/436,887

(22) Filed: Feb. 8, 2024

(65) Prior Publication Data

US 2024/0188405 A1 Jun. 6, 2024

Related U.S. Application Data

(63) Continuation of application No. 17/355,612, filed on Jun. 23, 2021, now Pat. No. 11,930,689.

(30) Foreign Application Priority Data

Sep. 8, 2020 (KR) .......... 10-2020-0114287

(51) Int. Cl.
*B32B 37/00* (2006.01)
*B32B 38/18* (2006.01)
(Continued)

(52) U.S. Cl.
CPC ............ *H10K 71/00* (2023.02); *B32B 37/003* (2013.01); *B32B 37/0046* (2013.01); *B32B 38/1866* (2013.01); *H10K 50/841* (2023.02); *B32B 2457/20* (2013.01); *H10K 59/12* (2023.02); *H10K 2102/311* (2023.02); *Y10T 156/1028* (2015.01)

(58) Field of Classification Search
CPC ............. B32B 37/003; B32B 37/0046; B32B 2457/20; H01K 71/00
See application file for complete search history.

(56) References Cited

U.S. PATENT DOCUMENTS

2017/0050424 A1 2/2017 Son et al.
2018/0056638 A1 3/2018 Choi et al.
(Continued)

FOREIGN PATENT DOCUMENTS

KR 1020150077829 A 7/2015
KR 101578442 B1 12/2015
(Continued)

*Primary Examiner* — Scott W Dodds
(74) *Attorney, Agent, or Firm* — CANTOR COLBURN LLP

(57) ABSTRACT

A bonding device includes: a support in which a plurality of through-holes is defined, a diaphragm disposed on the support to cover the support, a pressing pad disposed on the diaphragm over a top surface of the support, and a window fixing chuck disposed on the pressing pad and in which a groove facing the pressing pad is defined. Here, the pressing pad includes a pad and at least one support bar disposed in the pad and extending in a first direction.

15 Claims, 23 Drawing Sheets

(51) Int. Cl.
  *H10K 50/84* (2023.01)
  *H10K 71/00* (2023.01)
  *H10K 59/12* (2023.01)
  *H10K 102/00* (2023.01)

(56) References Cited

U.S. PATENT DOCUMENTS

| | | | |
|---|---|---|---|
| 2018/0086034 A1* | 3/2018 | Lee | .................. B41M 7/0027 |
| 2018/0093464 A1 | 4/2018 | Lee et al. | |
| 2020/0009803 A1* | 1/2020 | Kang | .................. B32B 3/04 |
| 2020/0203672 A1 | 6/2020 | Kuon et al. | |
| 2020/0350509 A1 | 11/2020 | Sim et al. | |
| 2021/0384479 A1 | 12/2021 | Lee et al. | |
| 2021/0384480 A1 | 12/2021 | Lee et al. | |

FOREIGN PATENT DOCUMENTS

| | | |
|---|---|---|
| KR | 1020160013472 A | 2/2016 |
| KR | 101706617 B1 | 2/2017 |
| KR | 101962365 B1 | 7/2019 |
| KR | 1020200005708 A | 1/2020 |
| KR | 1020210150647 A | 12/2021 |
| KR | 1020210152065 A | 12/2021 |

\* cited by examiner

BONDING DEVICE AND METHOD OF MANUFACTURING DISPLAY DEVICE USING THE SAME

This U.S. application is a continuation of U.S. patent application Ser. No. 17/355,612, filed on Jun. 23, 2021, which claims priority to Korean Patent Application No. 10-2020-0114287, filed on Sep. 8, 2020, and all the benefits accruing therefrom under 35 U.S.C. § 119, the content of which in its entirety is herein incorporated by reference.

BACKGROUND

The present disclosure herein relates to a bonding device and a method of manufacturing a display device using the same.

An electronic device for providing an image to a user, e.g., a smartphone, a digital camera, a laptop computer, a navigation unit, and a smart television, includes a display device for displaying an image. The display device generates an image to provide the generated image to the user through a display screen.

As technologies of the display device are developed, various types of display devices are developed. For example, the display device capable of displaying an image on a front surface as well as a rear surface and a side surface thereof are developed.

The display device includes a display panel for displaying an image and a window disposed on the display panel to protect the display panel. Each of the display panel and the window may be molded to be disposed along the front surface, rear surface, and side surface of the display device in order to display an image on the front surface, rear surface, and side surface of the display device.

SUMMARY

The present disclosure provides a bonding device capable of preventing a bonding defect between a display panel and a window and a method of manufacturing a display device using the same.

An embodiment of the inventive concept provides a bonding device including: a support in which a plurality of through-holes is defined; a diaphragm disposed on the support to cover the support; a pressing pad disposed over the diaphragm on a top surface of the support; and a window fixing chuck disposed on the pressing pad and in which a groove facing the pressing pad is defined. Here, the pressing pad includes: a pad; and at least one support bar disposed in the pad and extending in a first direction.

In an embodiment of the inventive concept, a method of manufacturing a display device includes: preparing a diaphragm disposed on a support to cover the support and a pressing pad disposed on the diaphragm over a top surface of the support; arranging a display panel on side surfaces of the diaphragm and the pressing pad, where side surfaces of the diaphragm are adjacent to side surfaces of the support; arranging a window in a groove of a window fixing chuck disposed above the pressing pad; arranging the diaphragm and the pressing pad in the groove; bonding a first bent portion of the display panel to a second bent portion of the window, which is adjacent to the first bent portion, by moving the window fixing chuck in a direction toward the pressing pad to press the pressing pad, where the first bent portion is disposed on the pressing pad; and bonding first flat portions of the display panel to second flat portions of the window by expanding the diaphragm, wherein each of the first flat portions extends from the first bent portion in a direction the window fixing chuck moves and is adjacent to the side surfaces of the diaphragm, and the second flat portions are adjacent to the first flat portions.

In an embodiment of the inventive concept, a bonding device includes: a support in which a plurality of through-holes is defined; a diaphragm disposed on the support to cover the support; a pressing pad disposed on the diaphragm on a top surface of the support; and a window fixing chuck disposed on the pressing pad and in which a groove facing the pressing pad is defined. Here, the pressing pad is deformable by a pressure caused by the window fixing chuck when the window fixing chuck moves such that the pressing pad is disposed in the groove.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
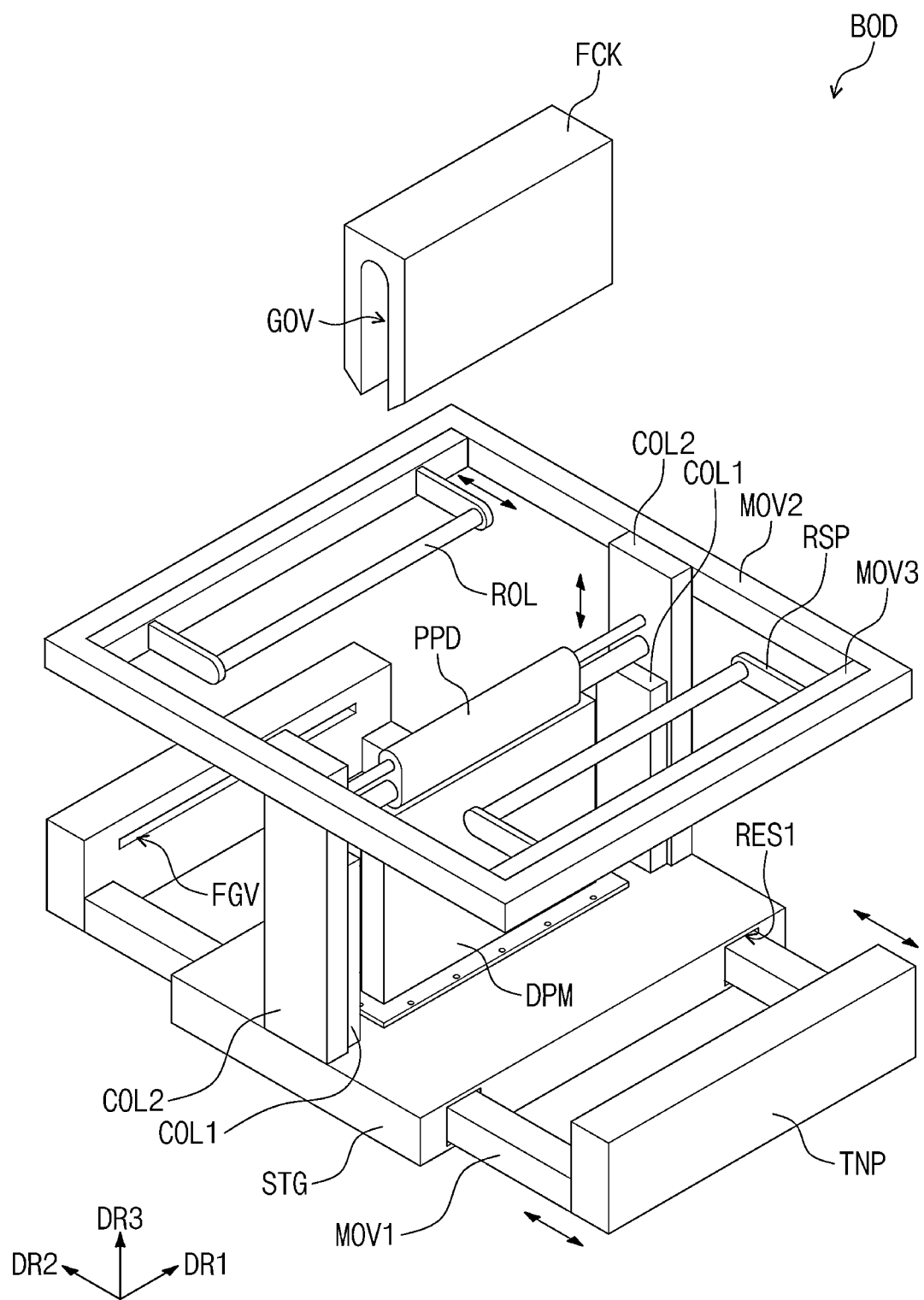
FIG. 1 is a perspective view illustrating a bonding device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described in detail with reference to the accompanying drawings.

FIG. 1 is a perspective view illustrating a bonding device according to an embodiment of the inventive concept.

Referring to FIG. 1, a bonding device BOD according to an embodiment of the inventive concept may include: a stage STG, a diaphragm DPM, a pressing pad PPD, a plurality of columns COL1 and COL2, a plurality of tension parts TNP, a plurality of first moving parts MOV1, a second moving part MOV2, a plurality of third moving parts MOV3, a plurality of rollers ROL, a plurality of roller supports RSP, and a window fixing chuck FCK.

The stage STG may have a flat surface defined by a first direction DR1 and a second direction DR2 crossing the first direction DR1. Each of the columns COL1 and COL2 may be disposed on the stage STG and extend in a third direction DR3.

The third direction DR3 may be defined as a direction that crosses the plane defined by the first and second directions DR1 and DR2 in a substantially perpendicular manner. Hereinafter, in this specification, spatially relative terms, such as "above", "on", "below", "upper direction" "lower direction" and the like, may represent a relative position and direction of components with respect to the third direction DR3. Also, an expression "viewed on a plane" or "in a plan view" may be defined as a state when viewed in the third direction DR3.

The column COL1 and COL2 may include a plurality of first columns COL1 and a plurality of second columns COL2. The first columns COL1 may be disposed between the second columns COL2. The first columns COL1 may be arranged in the first direction DR1 and face each other in the first direction DR1.

The second columns COL2 may be disposed on both sides of the stage STG, and the both sides are opposite to each other in the first direction DR1. The second columns COL2 may be arranged in the first direction DR1 and face each other in the first direction DR1. Each of the second columns COL2 may have a length greater than that of each of the first columns COL1 in the third direction DR3.

The diaphragm DPM may be disposed on the stage STG. Although not shown, a support may be disposed in the diaphragm DPM, and the support will be described below in FIG. 5. The diaphragm DPM may be disposed between the first columns COL1.

The pressing pad PPD may be disposed on the diaphragm DPM. The pressing pad PPD may extend in the first direction DR1 to be disposed on the first columns COL1 and be connected to the second columns COL2.

The tension parts TNP may face both sides of the stage STG, and the both sides are opposite to each other in the second direction DR2. The tension parts TNP may each extend in the first direction DR1.

The first moving parts MOV1 may be disposed between the tension parts TNP and the both sides of the stage STG, and the both sides are opposite to each other in the second direction DR2. The first moving parts MOV1 may be inserted to recessed portions RES1 defined at the both sides of the stage STG, which are opposite to each other in the second direction DR2, and move in the second direction DR2 (See corresponding arrow direction in FIG. 1). The first moving parts MOV1 may be connected to the tension parts TNP and move the tension parts TNP in the second direction DR2.

Although not shown, driving units for driving the first moving parts MOV1 may be disposed in the stage STG. However, the embodiment of the inventive concept is not limited to the position of the driving units for driving the first moving parts MOV1 above.

The second moving part MOV2 may have a frame shape. For example, although the second moving part MOV2 may have a rectangular frame shape, the embodiment of the inventive concept is not limited to the shape of the second moving part MOV2 above. The second moving part MOV2 may be connected to the second columns COL2. The second moving part MOV2 may be connected to outer surfaces of the second columns COL2, and the outer surfaces are opposite to inner surfaces, which face each other, of the second columns COL2. The second moving part MOV2 may move in the third direction DR3 (See corresponding arrow direction in FIG. 1).

Although not shown, driving units for driving the second moving part MOV2 may be disposed in the second columns COL2. However, the embodiment of the inventive concept is not limited to the positions of the driving units for driving the second moving part MOV2 above.

The third moving parts MOV3 may each extend in the first direction DR1 and face each other in the second direction DR2. The third moving parts MOV3 may be connected to inner surfaces of the second moving part MOV2. Here, the inner surfaces of the second moving part MOV2 face each other in the first direction DR1. The third moving parts MOV3 may be disposed adjacent to the inner surfaces of the second moving part MOV2, respectively. Here, the inner surfaces of the second moving part MOV2 face each other in the first direction DR1. The third moving parts MOV3 may move in the second direction DR2 (See corresponding arrow direction in FIG. 1).

Although not shown, driving units for driving the third moving parts MOV3 may be disposed in the second moving part MOV2. However, the embodiment of the inventive concept is not limited to the positions of the driving units for driving the third moving parts MOV3 above.

The roller supports RSP may each extend in the second direction DR2. The roller supports RSP may be connected to the third moving parts MOV3. The roller supports RSP connected to each of the third moving parts MOV3 may be arranged in the first direction DR1.

Each of the rollers ROL may be disposed between the roller supports RSP connected to each of the third moving parts MOV3 and connected to the roller supports RSP. Each of the rollers ROL may have a cylindrical shape extending in the first direction DR1. The rollers ROL may face each other in the second direction DR2. The rollers ROL may move in the second direction DR2 by the third moving parts MOV3 and move in the third direction DR3 by the second moving part MOV2.

The rollers ROL may rotate while being connected to the roller supports RSP. For example, the rollers ROL may rotate with respect to a rotation axis parallel to the first direction DR1. The rollers ROL may move in the second direction DR2 along the roller supports RSP.

The window fixing chuck FCK may be disposed higher than the pressing pad PPD. A groove GOV extending in the first direction DR1 may be defined in the window fixing chuck FCK. The groove GOV may have an inner end having a concave shape.

Figure 2:
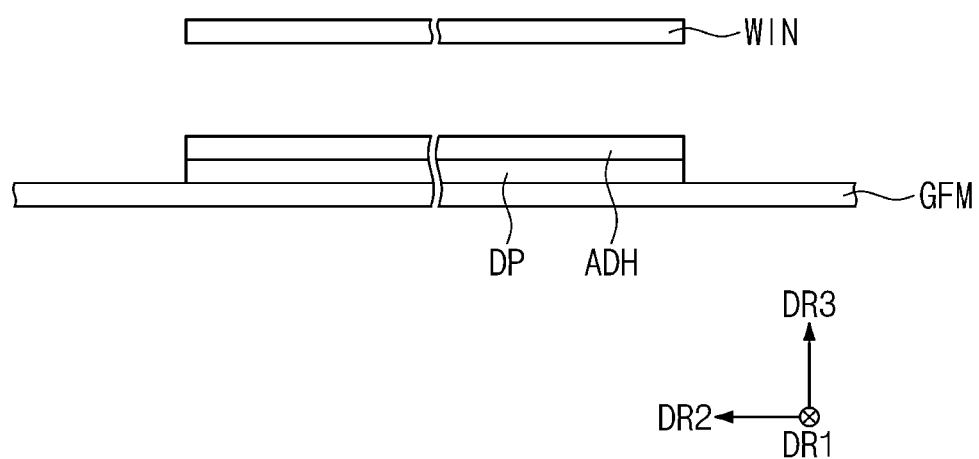
FIG. 2 is a view illustrating a display panel and a window, which are bonded to each other through the bonding device in FIG. 1.

FIG. 2 is a view illustrating a display panel and a window, which are bonded to each other through the bonding device in FIG. 1.

FIG. 2 exemplarily illustrates side surfaces of a display panel DP and a window WIN when viewed in the first direction DR1.

Referring to FIG. 2, in the bonding device BOD, the display panel DP to be bonded to the window WIN may be disposed on the pressing pad PPD and the diaphragm DPM. The window WIN may be disposed in the groove GOV of the window fixing chuck FCK. A shape of the display panel DP disposed on the pressing pad PPD and the diaphragm DPM and a shape of the window WIN disposed in the groove GOV of the window fixing chuck FCK will be illustrated in FIG. 14 below.

The display panel DP may be disposed on the pressing pad PPD and the diaphragm DPM through a guide film GFM instead of being directly disposed on the pressing pad PPD and the diaphragm DPM. For example, the guide film GFM may be prepared, and then the display panel DP may be disposed on the guide film GFM. The guide film GFM may be disposed on the pressing pad PPD and the diaphragm DPM (See FIG. 14).

The guide film GFM may include a flexible plastic material. For example, the guide film GFM may include a plastic material such as polyimide ("PI") or polyethylene-terephthalte ("PET").

The display panel DP may be a flexible display panel. The display panel DP according to an embodiment of the inventive concept may be a light emitting display panel. However, the embodiment of the inventive concept is not particularly limited thereto. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot or a quantum rod. Hereinafter, the display panel DP will be described as the organic light emitting display panel.

The window WIN may be disposed on the display panel DP. The window WIN may include glass. The window WIN may be defined as an ultra-thin glass ("UTG"). The ultra-thin glass may be tempered glass having strong durability that is not easily broken even when bent.

The window WIN may include a synthetic resin film in addition to glass. Also, the window WIN may have a multi-layer structure or a single-layer structure. For example, the window panel WIN may include a plurality of synthetic resin films coupled by an adhesive or a glass substrate and a synthetic resin film coupled by an adhesive.

An adhesive ADH may be disposed between the display panel DP and the window WIN. Although the adhesive ADH may include an optically clear adhesive ("OCA"), the embodiment of the inventive concept is not limited thereto.

The adhesive ADH may be firstly disposed on a top surface of the display panel DP. The adhesive ADH may be firstly disposed on the top surface of the display panel DP, and then the window WIN may be bonded to the adhesive ADH. The display panel DP and the window WIN may be bonded to each other by the adhesive ADH. The bonding device BOD in FIG. 1 may be used to bond the display panel DP and the window WIN to each other.

After the display panel DP is bonded to the window WIN, the guide film GFM may be separated from the display panel DP. Although not shown, an adhesive for bonding the guide film GFM to the display panel DP may be disposed between the guide film GFM and the display panel DP. The window WIN bonded to the display panel DP may protect the display panel DP from external scratches and impacts.

Although not shown, an input sensing part for sensing an external input and an anti-reflection layer for preventing external light from being reflected may be further disposed between the display panel DP and the window WIN.

Figure 3:
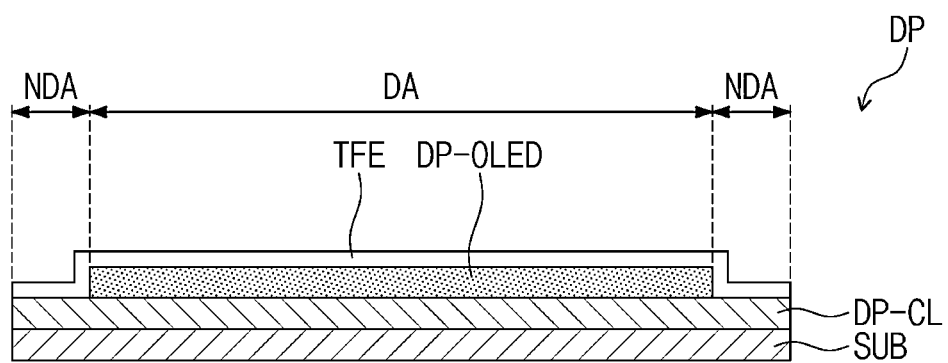
FIG. 3 is a cross-sectional view exemplarily illustrating the display panel in FIG. 2.
Figure 4:
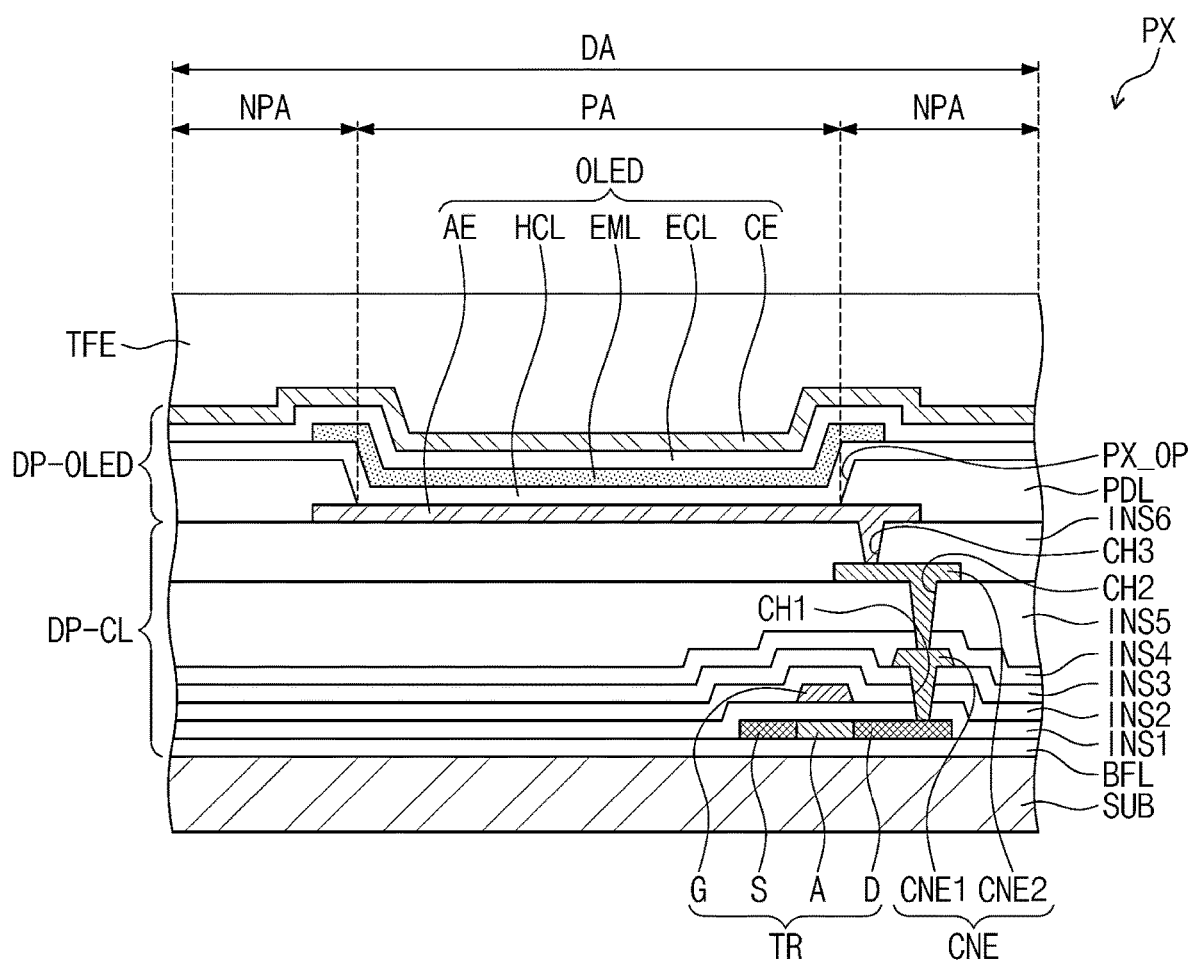
FIG. 4 is a cross-sectional view exemplarily illustrating one pixel disposed on a display device layer and a circuit device layer in FIG. 3.

FIG. 3 is a cross-sectional view exemplarily illustrating the display panel in FIG. 2. FIG. 4 is a cross-sectional view exemplarily illustrating one pixel disposed on a display device layer and a circuit device layer in FIG. 3.

Referring to FIG. 3, the display panel DP may include a substrate SUB, a circuit device layer DP-CL disposed on the substrate SUB, a display device layer DP-OLED disposed on the circuit device layer DP-CL, and a thin-film encapsulation layer TFE disposed on the display device layer DP-OLED.

The substrate SUB may include a display area DA and a non-display area NDA disposed around the display area DA. The substrate SUB may include a flexible plastic material such as polyimide (PI). The display device layer DP-OLED may be disposed on the display area DA.

A plurality of pixels may be disposed on each of the circuit device layer DP-CL and the display device layer DP-OLED. Each of the pixels may include a transistor disposed on the circuit device layer DP-CL and a light emitting device disposed on the display device layer DP-OLED and connected to the transistor.

The thin-film encapsulation layer TFE may be disposed on the circuit device layer DP-CL to cover the display device layer DP-OLED. The thin-film encapsulation layer TFE includes inorganic layers and/or an organic layer disposed between the inorganic layers. The inorganic layers may protect the pixels from moisture/oxygen. The organic layer may protect the pixels from foreign substances such as dust particles.

Referring to FIG. 4, a pixel PX may include a transistor TR and a light emitting device OLED. The light emitting device OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting device OLED may be disposed on the substrate SUB. Although one transistor TR is exemplarily illustrated, the pixel PX may substantially include a plurality of transistors for driving the light emitting device OLED and at least one capacitor. The display area DA may include a light emitting area PA in which the light emitting device OLED is disposed and a non-light emitting area NPA disposed around the light emitting area PA.

A buffer layer BFL may be disposed on the substrate SUB. The buffer layer BFL may be an inorganic layer. A semiconductor pattern may be disposed on the buffer layer BFL. The semiconductor pattern may include polysilicon. However, the embodiment of the inventive concept is not limited thereto. For example, the semiconductor pattern may include amorphous silicon or metal oxide.

The semiconductor pattern may be doped with an n-type dopant or a p-type dopant. The semiconductor pattern may include a highly doped area and a lightly doped area. The highly doped area may have conductivity greater than that of the lightly doped area. Substantially, the highly doped area may serve as a source electrode and a drain electrode of the transistor TR. The lightly doped area may substantially correspond to an active (or a channel) layer of the transistor.

A source S, an active A, and a drain D of the transistor TR may be provided from the semiconductor pattern. A first insulation layer INS1 may be disposed on the semiconductor pattern. A gate G of the transistor TR may be disposed on the first insulation layer INS1.

A second insulation layer INS2 may be disposed on the gate G. A third insulation layer INS3 may be disposed on the second insulation layer INS2. A connection electrode CNE for connecting the transistor TR and the light emitting device OLED may be disposed between the transistor TR and the light emitting device OLED. The connection electrode CNE may include a first connection electrode CNE1 and a second connection electrode CNE2 disposed on the first connection electrode CNE1.

The first connection electrode CNE1 may be disposed on the third insulation layer INS3 and connected to the drain D through a first contact hole CH1 defined in the first to third insulation layers INS1 to INS3. A fourth insulation layer INS4 may be disposed on the first connection electrode CNE1. A fifth insulation layer INS5 may be disposed on the fourth insulation layer INS4. The second connection electrode CNE2 may be disposed on the fifth insulation layer INS5. The second connection electrode CNE2 may be connected to the first connection electrode CNE1 through a second contact hole CH2 defined in the fifth insulation layer INS5.

A sixth insulation layer INS6 may be disposed on the second connection electrode CNE2. Layers from the buffer layer BFL to the sixth insulation layer INS6 may be defined as the circuit device layer DP-CL. Each of the first to sixth insulation layers INS1 to INS6 may be an inorganic layer or an organic layer.

The first electrode AE may be disposed on the sixth insulation layer INS6. The first electrode AE may be connected to the second connection electrode CNE2 through a third contact hole CH3 defined in the sixth insulation layer INS6. A pixel defining layer PDL for exposing a predetermined portion of the first electrode AE may be disposed on the first electrode AE and the sixth insulation layer INS6. An opening PX_OP for exposing a predetermined portion of the first electrode AE may be defined in the pixel defining layer PDL.

The hole control layer HCL may be disposed on the first electrode AE and the pixel defining layer PDL. The hole control layer HCL may be disposed on the light emitting area PA and the non-light emitting area NPA in common. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate one of red light, green light, and blue light.

The electron control layer ECL may be disposed on the light emitting layer EML and the hole control layer HCL. The electron control layer ECL may be disposed on the light emitting area PA and the non-light emitting area NPA in common. The electron control layer ECL may include an electron transport layer and an electron injection layer.

The second electrode CE may be disposed on the electron control layer ECL. The second electrode CE may be disposed in the pixels in common. The thin-film encapsulation layer TFE may be disposed on the light emitting device OLED. A layer on which the light emitting device OLED is disposed may be defined as the display device layer DP-OLED.

A first voltage may be applied to the first electrode AE through the transistor TR, and a second voltage having a level less than the first voltage may be applied to the second electrode CE. In this case, a hole and an electron, which are injected to the light emitting layer EML, may be coupled to provide an exciton, and, while the exciton is transferred to the ground state, the light emitting device OLED may emit light.

Figure 5:
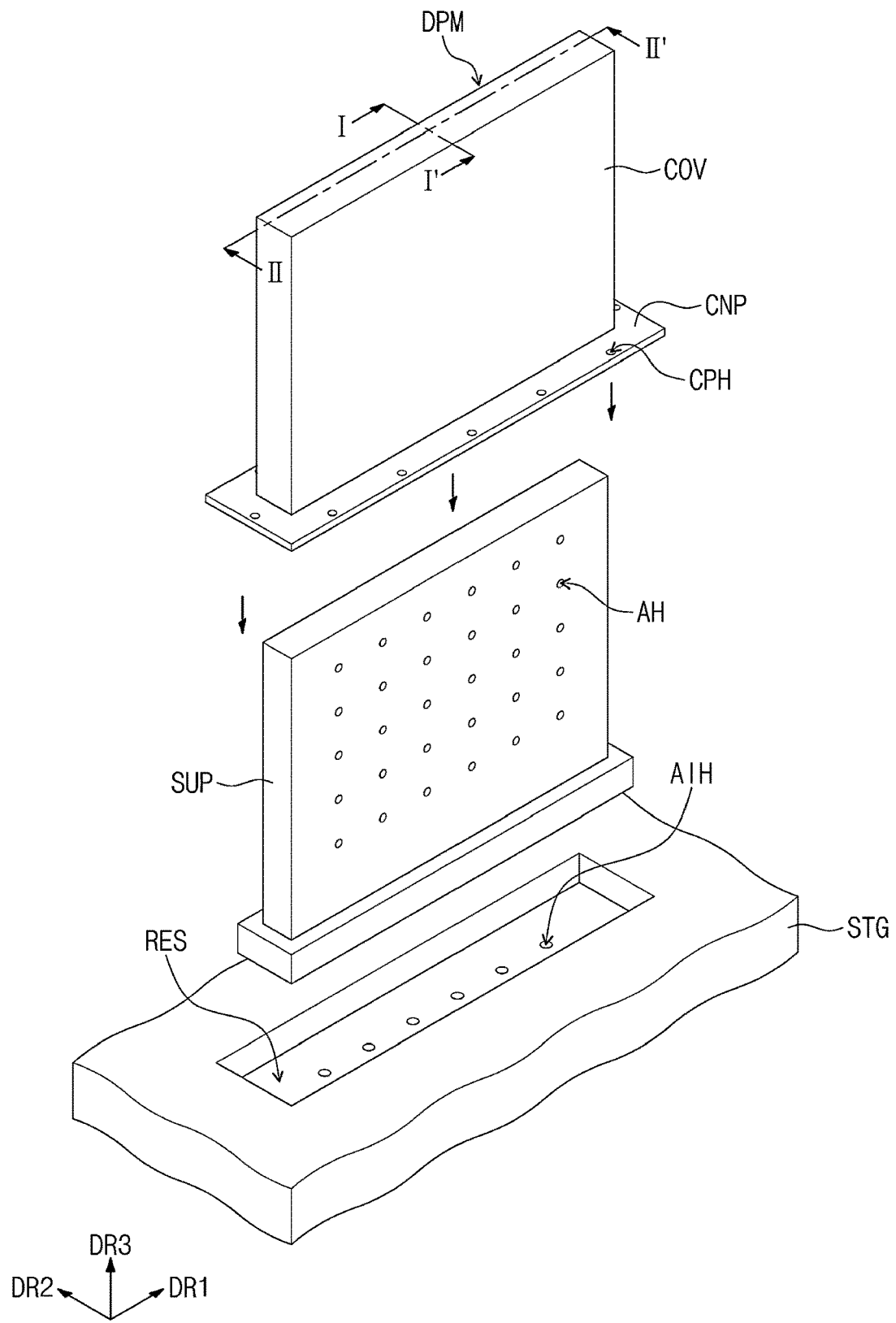
FIG. 5 is a perspective view illustrating a stage, a diaphragm, and a support disposed in the diaphragm in FIG. 1.

FIG. 5 is a perspective view illustrating the stage, the diaphragm, and the support disposed in the diaphragm in FIG. 1.

Referring to FIG. 5, a recessed portion RES may be defined in a top surface of the stage STG. A plurality of air injection holes AIH may be defined in the recessed portion RES. The support SUP may be disposed on the stage STG. The support SUP may have a lower portion disposed in the recessed portion RES.

The support SUP may extend in the first direction DR1 and the third direction DR3. The support SUP may have a plate shape defined by the first direction DR1 and the third direction DR3. The support SUP may have a flat top surface defined by the first and second directions DR1 and DR2. The top surface of the support SUP may extend further in the first direction DR1 than the second direction DR2.

The support SUP may have a rigid type and include stainless steel. The lower portion of the support SUP may have a width greater than the other portion of the support SUP with respect to the first and second directions DR1 and DR2.

A plurality of through-holes AH may be defined in the support SUP. The through-holes AH may be defined in both side surfaces of the support SUP. Here, the both side surfaces of the support SUP are opposite to each other in the second direction DR2.

The diaphragm DPM may be disposed on the support SUP to cover the support SUP. A structure in which the diaphragm DPM covers the support SUP will be illustrated in FIGS. 7 and 8 below. The diaphragm DPM may include a material having an elastic property and expanded by an external force. For example, the diaphragm DPM may include silicon.

The diaphragm DPM may include a cover portion COV for covering the support SUP and a connection portion CNP extending from a lower end of the cover portion COV. The connection portion CNP may extend in the first and second directions DR1 and DR2 to define a frame shape. A plurality of coupling holes CPH may be defined in the connection portion CNP.

Figure 6:
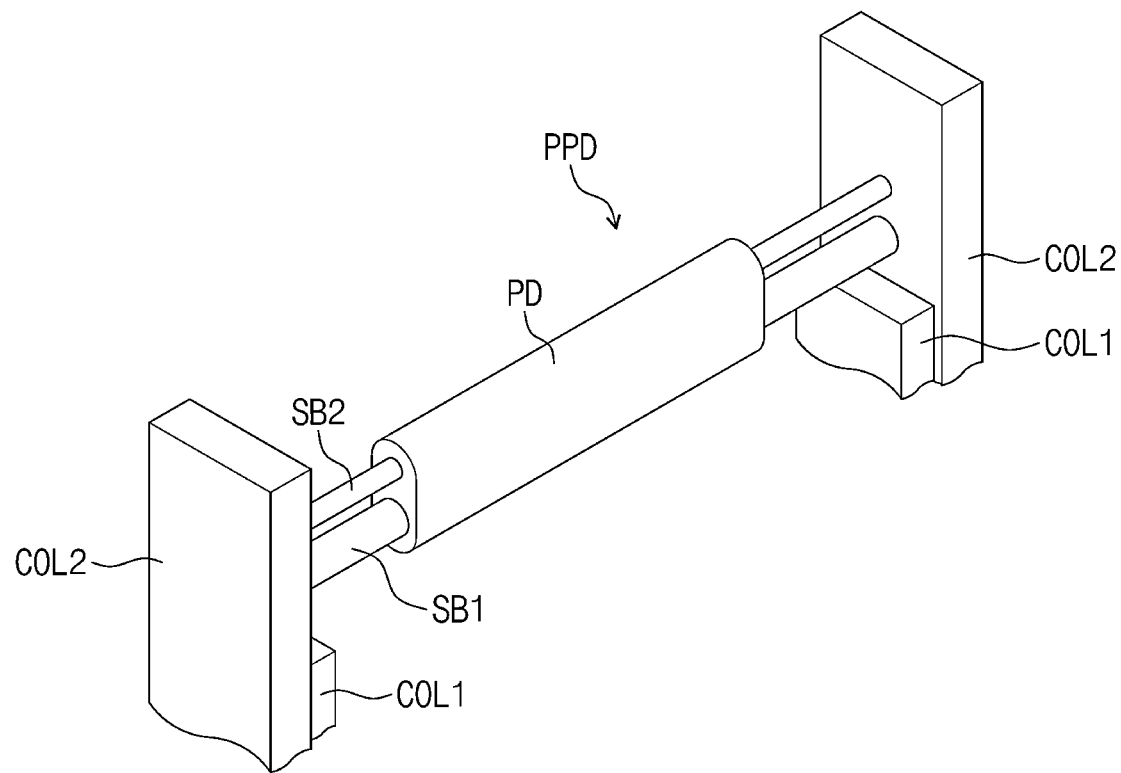
FIG. 6 is an enlarged perspective view illustrating a pressing pad in FIG. 1.

FIG. 6 is an enlarged perspective view illustrating the pressing pad in FIG. 1.

Referring to FIG. 6, the pressing pad PPD may include a pad PD extending in the first direction DR1 and a plurality of support bars SB1 and SB2 disposed in the pad PD and extending in the first direction DR1.

When viewed in the first direction DR1, the pad PD may have an approximately tower shape having a major axis extending in the third direction DR3. (See FIG. 7) When viewed in the first direction DR1, a top surface of the pad PD may have a curved surface that is convex toward an upward direction (i.e., direction toward the groove GOV). When viewed in the first direction DR1, a bottom surface of the pad PD may be a curved surface that is convex toward a downward direction (i.e., direction toward the diaphragm DPM).

The pad PD may have elasticity and be deformable by an external force. For example, the pad PD may include silicon having elasticity and being deformable by an external force. The pad PD may be supported by the support bars SB1 and SB2.

Each of the support bars SB1 and SB2 may have a cylindrical shape extending in the first direction DR1. However, the embodiment of the inventive concept is not limited to the shape of each of the support bars SB1 and SB2 above. Each of the support bars SB1 and SB2 may extend to the outside of the pad PD. For example, each of the support bars SB1 and SB2 may extend in the first direction DR1 further than the pad PD. Although two support bars SB1 and SB2 are exemplarily illustrated, the embodiment of the inventive concept is not limited to this number of the support bars.

Each of the support bars SB1 and SB2 may have rigidity greater than the pad PD. Each of the support bars SB1 and SB2 may include metal having rigidity greater than the pad PD. For example, the support bars SB1 and SB2 may include stainless steel. The support bars SB1 and SB2 may be disposed in the pad PD to support the pad PD.

The pad PD and the support bars SB1 and SB2 may be disposed between the second columns COL2. The support bars SB1 and SB2 may extend in the first direction DR1 to be disposed above the first columns COL1 and be connected to the second columns COL2. The support bars SB1 and SB2 may be connected to portions of the inner surfaces of the second columns COL2, and the connected portions are disposed above the first columns COL1. **

Both sides of each of the support bars SB1 and SB2 may be connected and fixed to the second columns COL2. However, the embodiment of the inventive concept is not limited thereto. For example, the both sides of each of the support bars SB1 and SB2 may be connected to the second columns COL2 and move by a predetermined distance in the third direction DR3. For the above-described configuration, elastic members that are vertically cushioned may be disposed in the second columns COL2 and connected to the both sides of each of the support bars SB1 and SB2.

The pad PD may not be connected to the first columns COL1. The pad PD may be supported by the support bars SB1 and SB2 connected to the second columns COL2.

The support bars SB1 and SB2 may include a first support bar SB1 extending in the first direction DR1 and a second support bar SB2 extending in the first direction DR1 and disposed on the first support bar SB1. The first support bar SB1 may have a different size from that of the second support bar SB2. The size may be defined as a diameter of each of the first support bar SB1 and the second support bar SB2.

Figure 7:
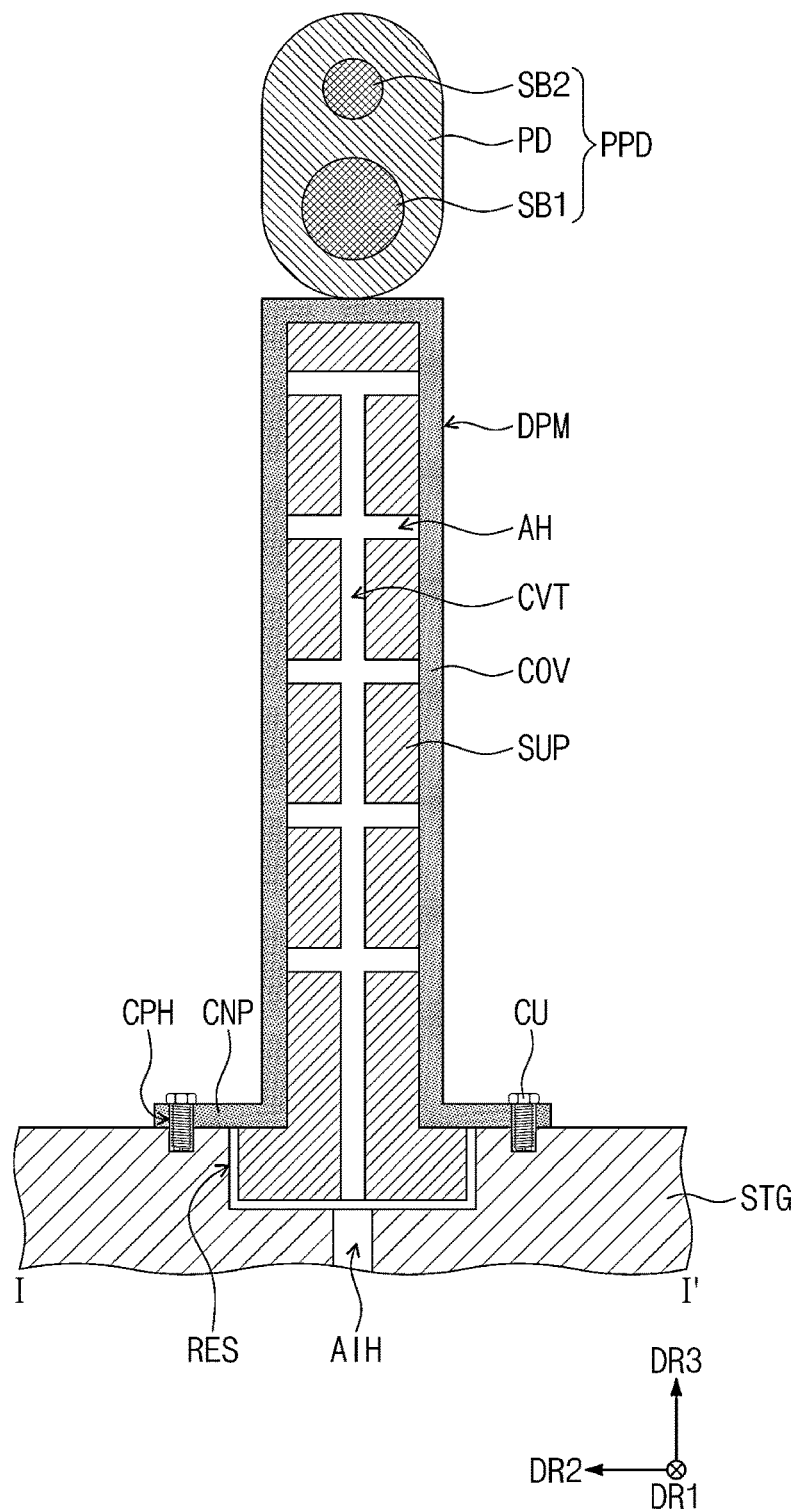
FIG. 7 is a cross-sectional view taken along line I-I' of FIG. 5.

FIG. 7 is a cross-sectional view taken along line I-I' of FIG. 5.

In FIG. 7, cross-sections of the stage STG6 in FIG. 1 and the pressing pad PPD in FIG. 6 are also exemplarily illustrated.

Referring to FIG. 7, the diaphragm DPM and the pressing pad PPD may be disposed on the support SUP. The pressing pad PPD may be disposed on the diaphragm DPM disposed on the top surface of the support SUP. The first and second support bars SB1 and SB2 may be disposed in the pad PD to support the pad PD.

The support SUP and the diaphragm DPM may be disposed on the stage STG. The support SUP may have the lower portion disposed in the recessed portion RES defined in the stage STG. A cavity CVT may be defined in the support SUP. The cavity CVT may be opened downward in the support SUP. The cavity CVT may be defined as a main air passage extending in the third direction DR3 and defined in the support SUP. The cavity CVT may be an air flow passage.

In an embodiment, for example, the cavity CVT may extend in the third direction DR3. However, the embodiment of the inventive concept is not limited thereto. In another embodiment, the cavity CVT may have a predetermined inclination angle with respect to the third direction DR3 and extend in an upward direction.

The through-holes AH may extend from the cavity CVT to the both side surfaces of the support SUP. Here, the both side surfaces of the support SUP are opposite to each other in the second direction DR2. Thus, the through-holes AH may be defined in the both side surfaces of the support SUP, which are opposite to each other in the second direction DR2.

In an embodiment, for example, the through-holes AH may each extend in the second direction DR2. However, the embodiment of the inventive concept is not limited thereto. In another embodiment, for example, each of the through-holes AH may have a predetermined inclination angle with respect to the second direction DR3 and extend toward the both side surfaces of the support SUP. Each of the through-holes AH may be defined as a sub-air passage extending in the second direction DR2. Each of the through-holes AH may be an air flow passage.

An air injection hole AIH defined in the stage STG in which the recessed portion RES is defined may extend in the third direction DR3. When viewed in the third direction DR3, the air injection hole AIH may overlap the cavity CVT. The air injection hole AIH may be defined as an air injection passage through which the air passes.

Although air AIR may be supplied to the air injection hole AIH, the cavity CVT, and the through-holes AH, the embodiment of the inventive concept is not limited thereto. For example, various gases including the air or various fluids may be supplied to the air injection hole AIH, the cavity CVT, and the through-holes AH.

The diaphragm DPM may cover the support SUP and then be connected to the stage STG. The cover portion COV may cover the support SUP. The connection portion CNP may extend from a lower end of the cover portion COV in parallel to the stage STG and be connected to the stage STG. In order to connect the connection portion CNP to the stage STG, a plurality of coupling units CU may be arranged in the coupling holes CPH and connected to the stage STG.

When viewed in the first direction DR1, a cross-section of the first support bar SB1 may have a size different from that of a cross-section of the second support bar SB2. For example, the cross-section of the first support bar SB1 may have a size greater than that of the cross-section of the second support bar SB2.

Figure 8A:
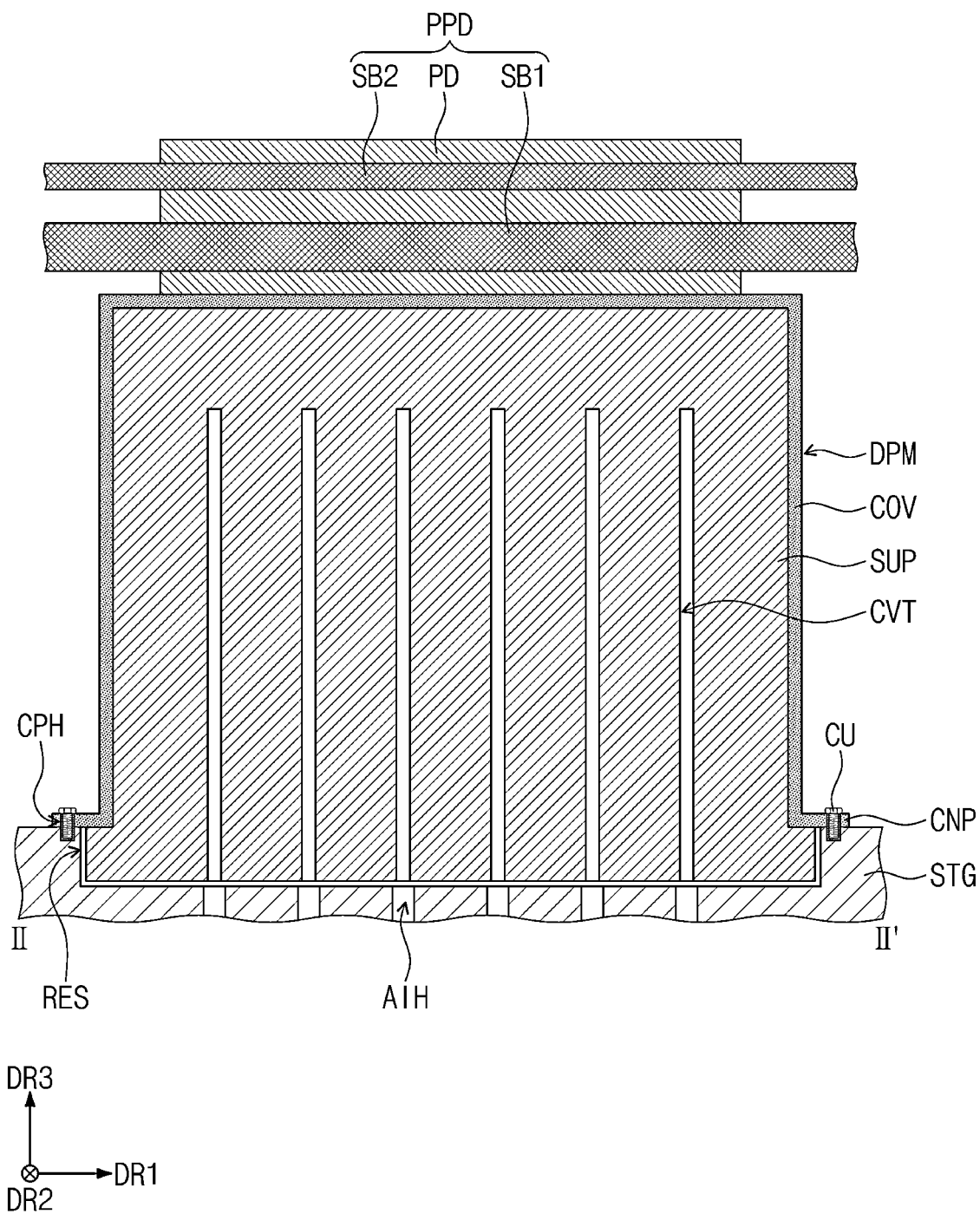
FIG. 8A is a cross-sectional view taken along line II-II' of FIG. 5.

FIG. 8A is a cross-sectional view taken along line II-II' of FIG. 5.

In FIG. 8A, cross-sections of the stage STG in FIG. 1 and the pressing pad PPD in FIG. 6 are also exemplarily illustrated.

Referring to FIG. 8A, the cavity CVT may be provided in plurality. The plurality of cavities CVT may each extend in the third direction DR3 and be arranged in the first direction DR1. When viewed on a plane (i.e., in a plan view), the cavities CVT may overlap the pad PD. The through-holes AH may extend from the cavities CVT.

A plurality of air injection holes AIH may be defined in a portion of the stage STG in which the recessed portion RES is defined. The air injection holes AIH may be defined in correspondence to the cavities CVT, respectively. When viewed on the plane, each of the air injection holes AIH may overlap the corresponding cavity CVT of the cavities CVT.

Figure 8B:
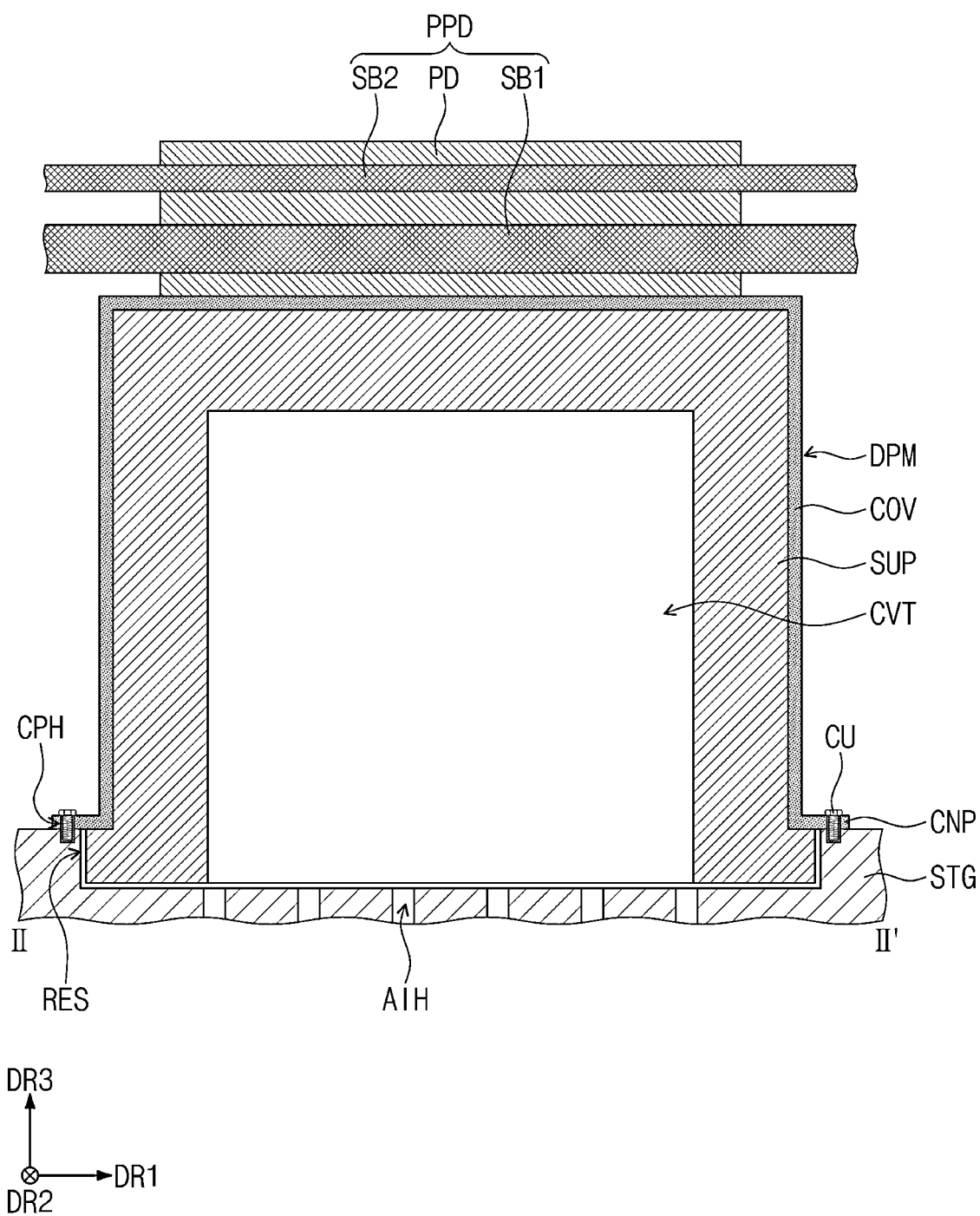
FIG. 8B is a view illustrating a shape of a cavity according to another embodiment of the inventive concept.

FIG. 8B is a view illustrating a shape of a cavity according to another embodiment of the inventive concept.

In an embodiment, for example, FIG. 8B illustrates another cross-sectional view corresponding to FIG. 8A. FIG. 8B illustrates the cross-sectional view when the support SUP is cut in the middle (See FIG. 7).

Referring to FIG. 8B, a single cavity CVT may be defined in a support SUP unlike the cavities in FIG. 8A. Unlike the structure in FIG. 8A, the further great single cavity CVT may be defined in a support SUP. When viewed on the plane, the single cavity CVT may overlap a pad PD. In this case, through-holes AH may extend from the single cavity CVT.

FIGS. 9 to 17 are views for explaining a method of manufacturing a display device by using the bonding device in FIG. 1.

In FIGS. 9 to 17, the display panel DP and the guide film GFM are exemplarily illustrated, but the adhesive ADH is omitted.

Figure 9:
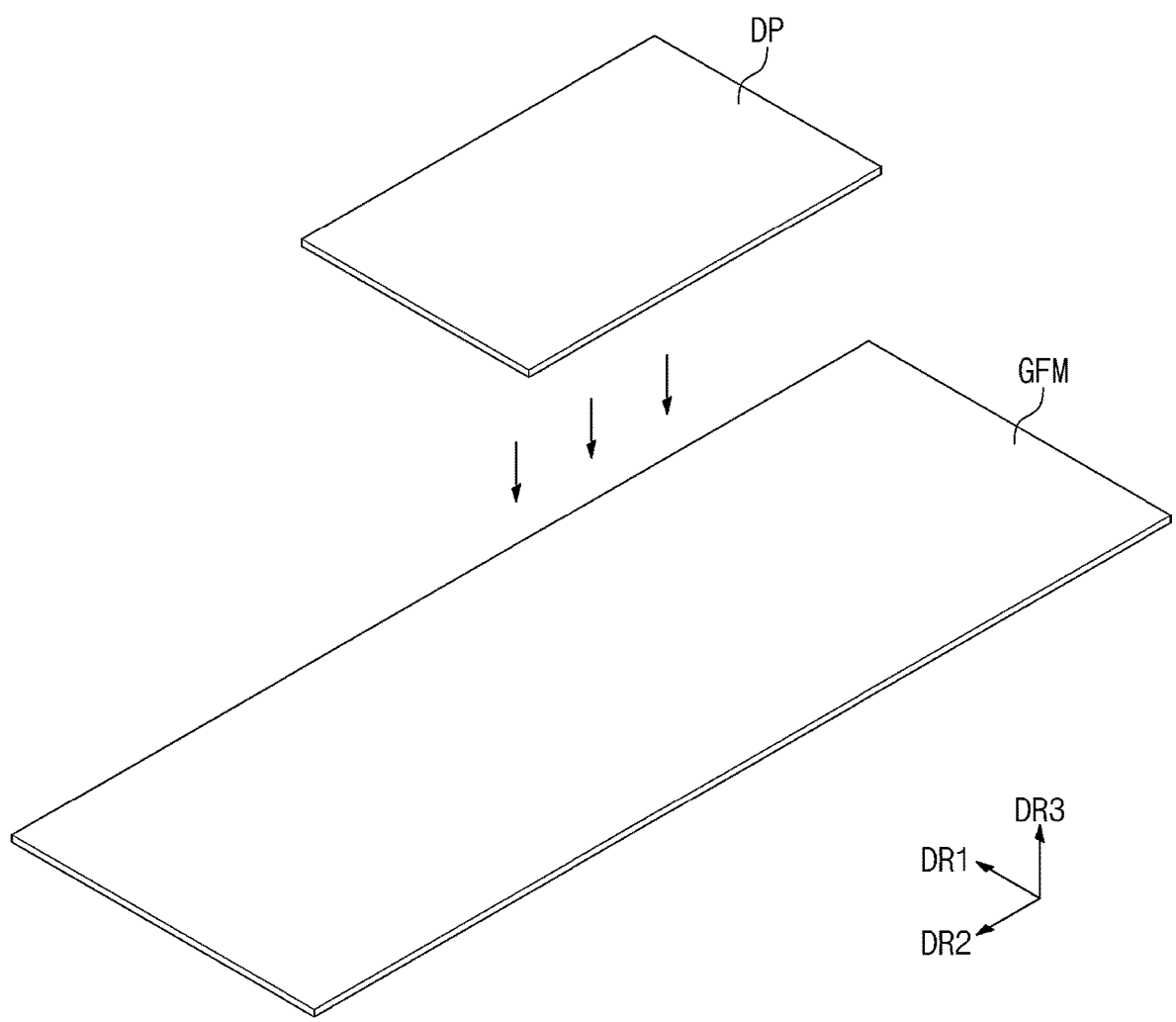
FIGS. 9 to 17 are views for explaining a method of manufacturing a display device by using the bonding device in FIG. 1.

Referring to FIG. 9, the guide film GFM may have a length greater than that of the display panel DP in the second direction DR2. The display panel DP may be disposed on the guide film GFM and bonded to the guide film GFM. A process of bonding the guide film GFM and the display panel DP may be performed in a first process chamber (not shown). Although not shown, the adhesive ADH may be disposed on the display panel DP. Also, an adhesive for bonding the display panel DP to the guide film GFM may be further used.

The guide film GFM and the display panel DP, which are bonded to each other, may be transferred to a second process chamber (not shown). In the second process chamber, a process of bonding the window WIN to the display panel DP may be performed. All of processes to be described below may be substantially performed in the second process chamber.

Figure 10:
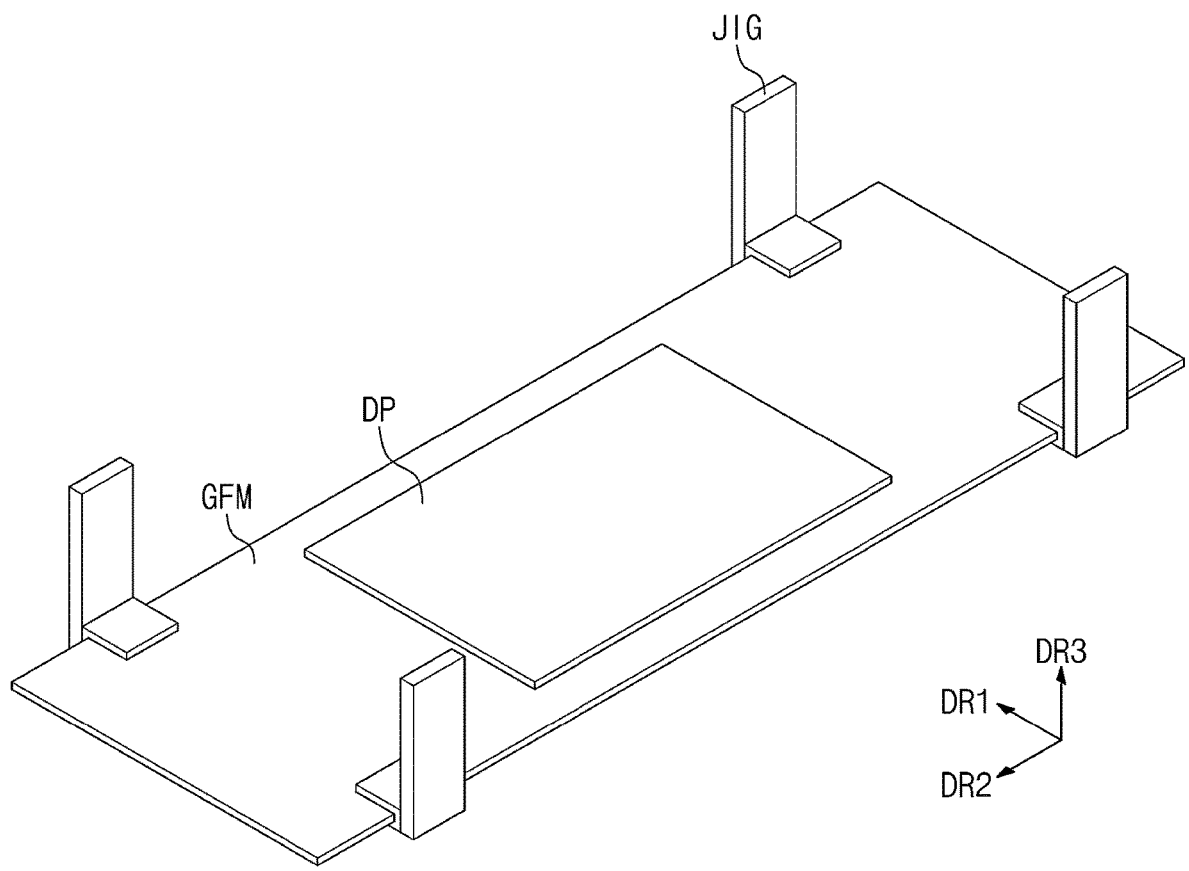

Referring to FIG. 10, a plurality of jigs JIG may be provided and disposed on portions of the guide film GFM. The portions are adjacent to both ends of the guide film GFM in the second direction DR2. The jigs JIG may hold both sides of the guide film GFM, which are opposite to each other in the first direction DR1. Therefore, four jigs JIG may hold the guide film GFM on the portions above, respectively, as shown in FIG. 10. However, this is merely exemplarily, and the embodiment of the inventive concept is not limited to this number of the jigs JIG. The guide film GFM may be transferred by the jigs JIG.

Figure 11:
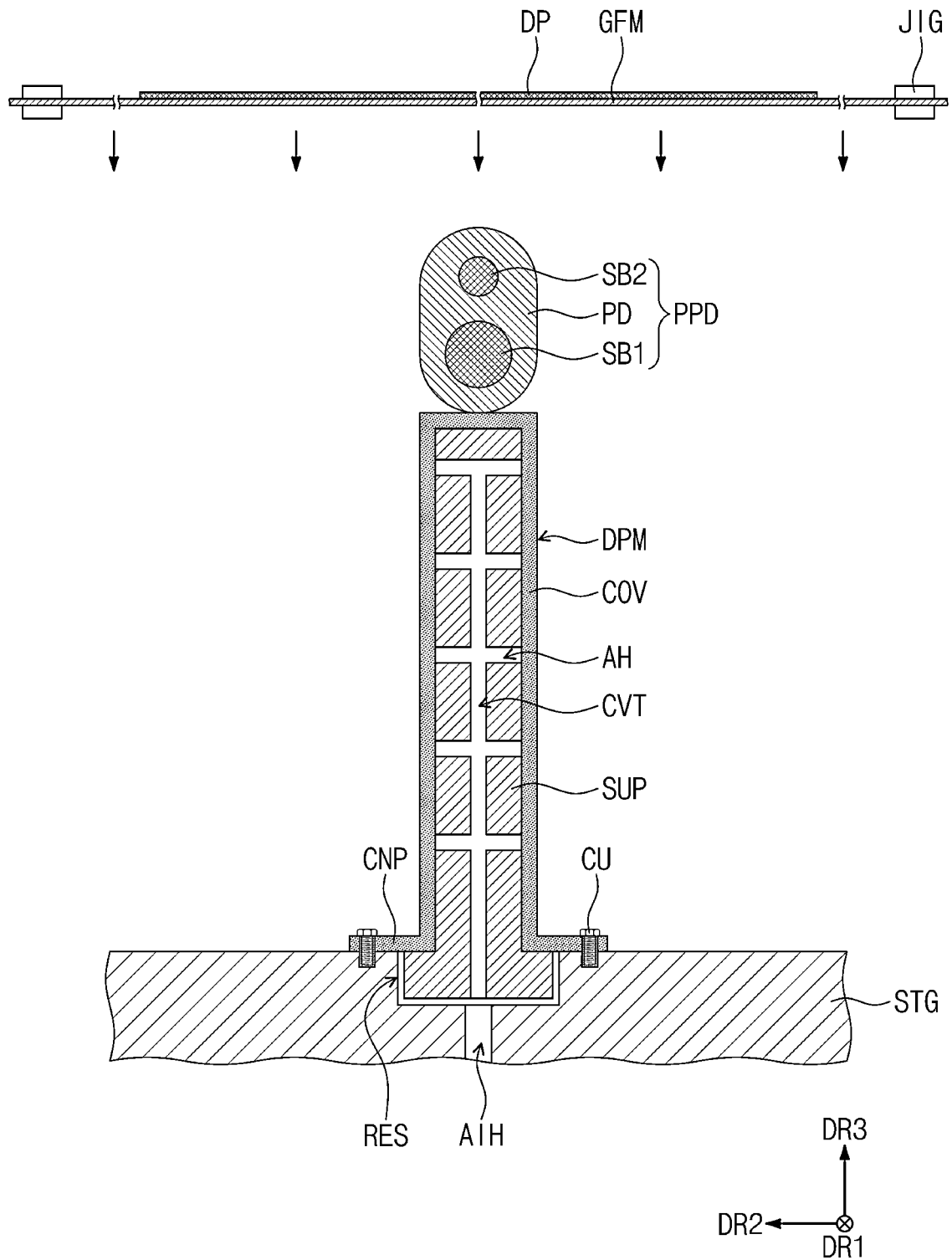

Referring to FIG. 11, the guide film GFM may be disposed on the diaphragm DPM and the pressing pad PPD by the jigs JIG. The jigs JIG may move in a downward direction (i.e., direction toward the pressing pad PPD) to provide the guide film GFM on the pressing pad PPD.

Figure 12:
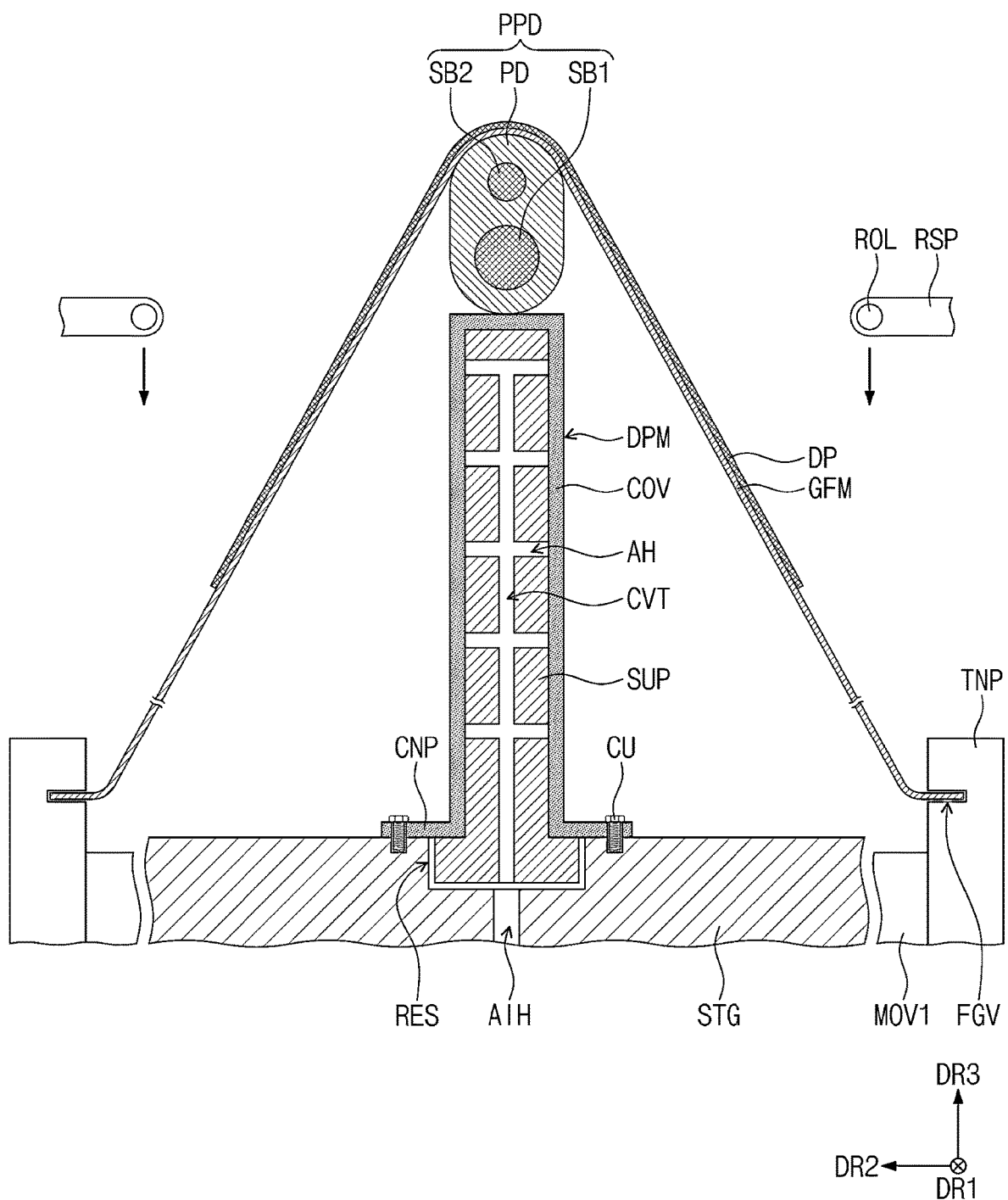

Referring to FIGS. 11 and 12, the guide film GFM may move in the downward direction by the jigs JIG, and a portion of the guide film GFM, which overlaps a central portion of the display panel DP, may be disposed on the pressing pad PPD. The portion of the guide film GFM, which overlaps the central portion of the display panel DP, may contact the pad PD of the pressing pad PPD. The central portion of the display panel DP, which contacts the pad PD, may be bent along the curved surface of the top surface of the pad PD.

The jigs JIG may transfer the both ends of the guide film GFM in the downward direction so that the both ends are disposed in fixing grooves FGV defined in the tension parts TNP. Thereafter, the jigs JIG may be removed from the guide film GFM.

The both ends of the guide film GFM may be fixed to the fixing grooves FGV. Although not shown, fixing units (e.g., screws for pressing the guide film) may be disposed in the fixing grooves FGV to fix the both ends of the guide film GFM. The tension parts TNP may move to be spaced apart from each other by the first moving parts MOV1 in the second direction DR2 so that the guide film GFM is unfolded to be flat.

Figure 13:
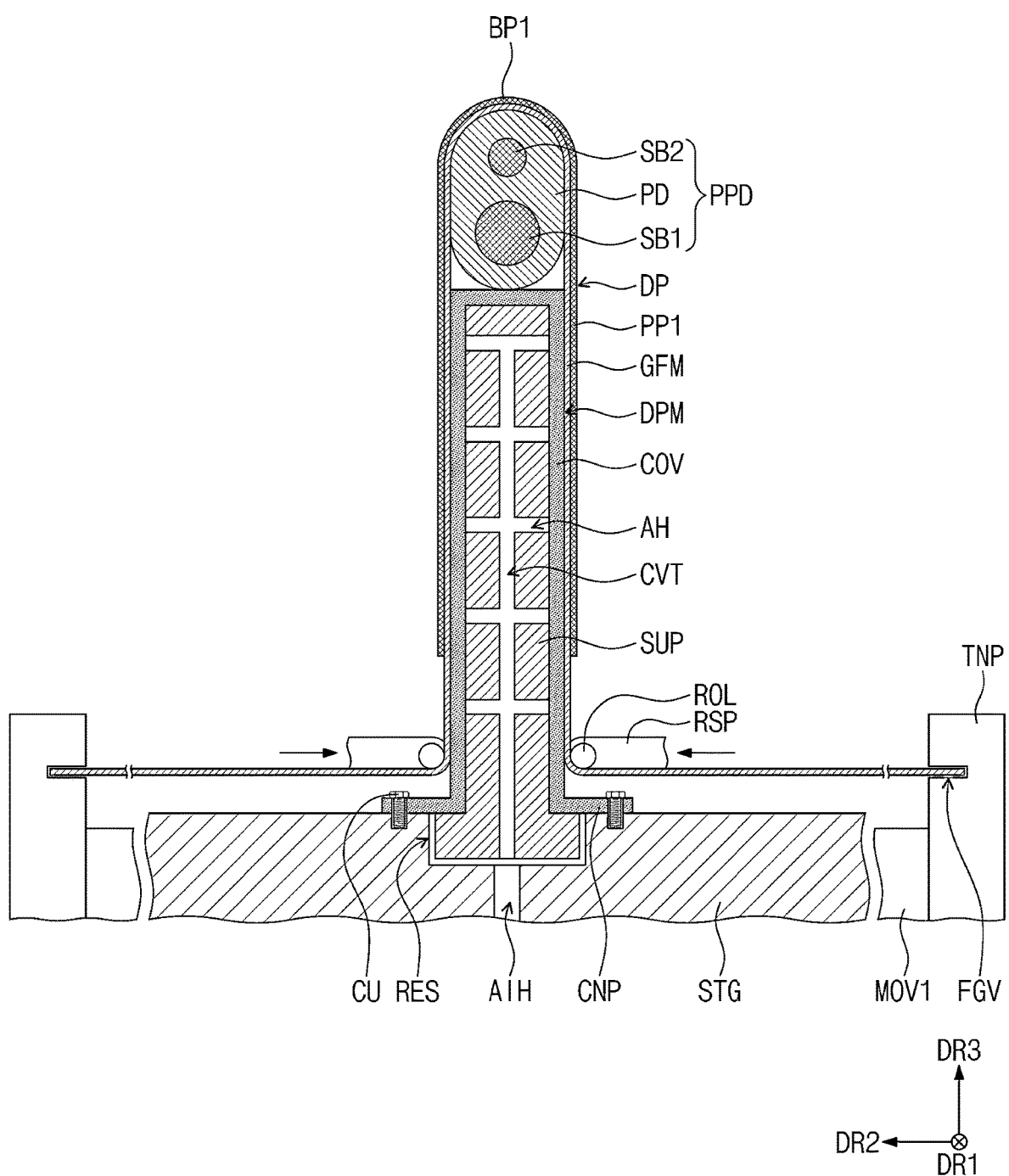

Referring to FIGS. 12 and 13, the rollers ROL may move in the second direction DR2 and the third direction DR3. As described above, the rollers ROL may move in the third direction DR3 (i.e., move downwards) by the second moving part MOV2 and move in the second direction DR2 by the third moving parts MOV3. That is, the two rollers move in opposite direction along the second direction DR2 to be closer to each other.

The rollers ROL may contact the guide film GFM to transfer the guide film GFM. The rollers ROL may contact portions of the guide film GFM, which are adjacent to the display panel DP. The rollers ROL may be disposed adjacent to a lower end of the support SUP. The rollers ROL may be disposed adjacent to the side surfaces of the support SUP, which are opposite to each other in the second direction DR2. The rollers ROL may be disposed adjacent to a lower end of the diaphragm DPM. For example, the rollers ROL may be disposed adjacent to a lower end of the cover portion COV.

The guide film GFM may be disposed on the pressing pad PPD and side surfaces of the diaphragm DPM, and the display panel DP may be disposed on the pressing pad PPD and the side surfaces of the diaphragm DPM by the guide film GFM. The side surfaces of the diaphragm DPM may be defined as portions of the diaphragm DPM, the side surfaces of the diaphragm DPM may be disposed adjacent to the side surfaces of the support, and be opposite to each other in the second direction DR2.

The display panel DP may be spaced upward from the rollers ROL. Substantially, the rollers ROL may guide the display panel DP so that the display panel DP is disposed adjacent to the support SUP and the diaphragm DPM.

As the guide film GFM moves by the rollers ROL, the tension parts TNP may also move in conjunction with the rollers ROL. As the rollers ROL move to be adjacent to each other in a direction toward the support SUP, the tension parts TNP may move to be adjacent to each other in the second direction DR2 by the first moving parts MOV1.

Hereinafter, the tension parts TNP will be omitted from FIG. 14.

Figure 14:
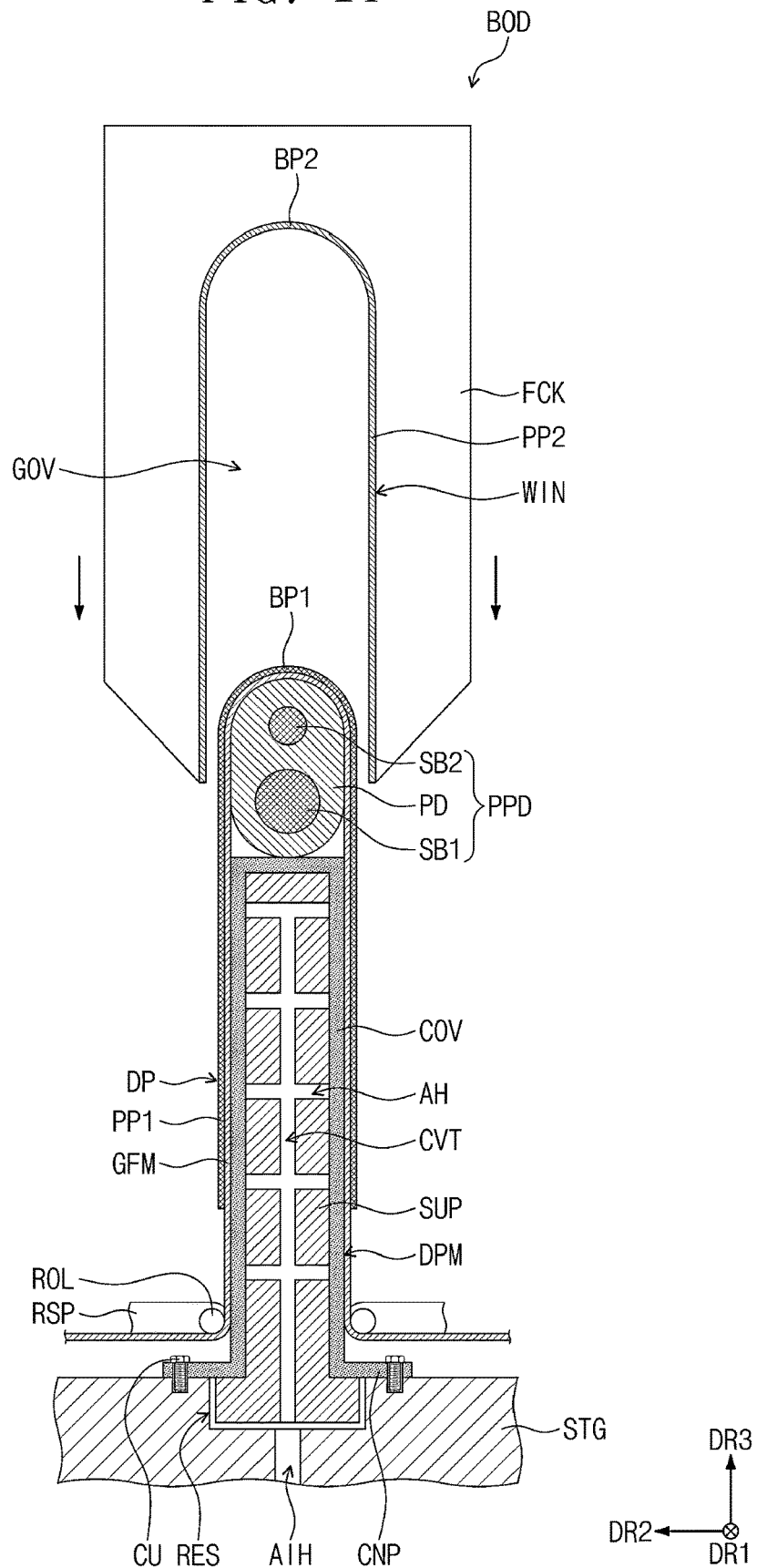

Referring to FIG. 14, the window fixing chuck FCK may be disposed on the diaphragm DPM and the pressing pad PPD. The window fixing chuck FCK may be disposed to face the diaphragm DPM and the pressing pad PPD. Substantially, the stage STG may move to a position at which the window fixing chuck FCK is disposed so that the window fixing chuck FCK is disposed on the pressing pad PPD.

The groove GOV defined in the window fixing chuck FCK may face the pressing pad PPD. An inner end of the groove GOV, which faces the support SUP, may have a concave shape. Specifically, the window fixing chuck FCK may have a concave curved surface at the inner end of the groove GOV facing the top surface of the pad PD.

The window WIN may be disposed in the groove GOV of the window fixing chuck FCK. The window WIN disposed in the groove GOV may have a bent shape. Although not shown, vacuum adsorption holes for adsorbing and fixing the window WIN may be defined in an inner surface of the window fixing chuck FCK in which the groove GOV is defined.

Although not shown in FIG. 14, the adhesive ADH may be disposed on the display panel DP.

As the display panel DP is disposed along the top surface, which has the convex curved surface, of the pad PD and the support SUP having the plate shape extending in the third direction DR3, the display panel DP may have a bent shape. The display panel DP may include a first bent portion BP1 and first flat portions PP1. each of the first flat portions PP1 has a flat shape extending from the first bent portion BP1.

The first bent portion BP1 may be disposed on the pad PD having a curved surface. The first flat portions PP1 may each extend from the first bent portion BP1 in the downward direction (i.e., the third direction DR3) and be disposed on the side surfaces of the diaphragm DPM, which are disposed adjacent to the side surfaces of the support SUP. Also, the first flat portions PP1 may be disposed on the side surfaces of the pad PD, which are opposite to each other in the second direction DR2. When the display panel DP is unbent, the first bent portion BP1 may be disposed between the first flat portions PP1.

The window WIN may include a second bent portion BP2 corresponding to the first bent portion BP1 and second flat portions PP2 corresponding to the first flat portions PP1. The second flat portions PP2 may each extend from the second bent portion BP2 in the downward direction (i.e., the third direction DR3).

When the window WIN is unbent, the second bent portion BP2 may be disposed between the second flat portions PP2. The first bent portion BP1 may be bonded to the second bent portion BP2, and the first flat portions PP1 may be bonded to the second flat portions PP2 by the bonding device BOD. The above-described operation will be described below in detail.

Figure 15A:
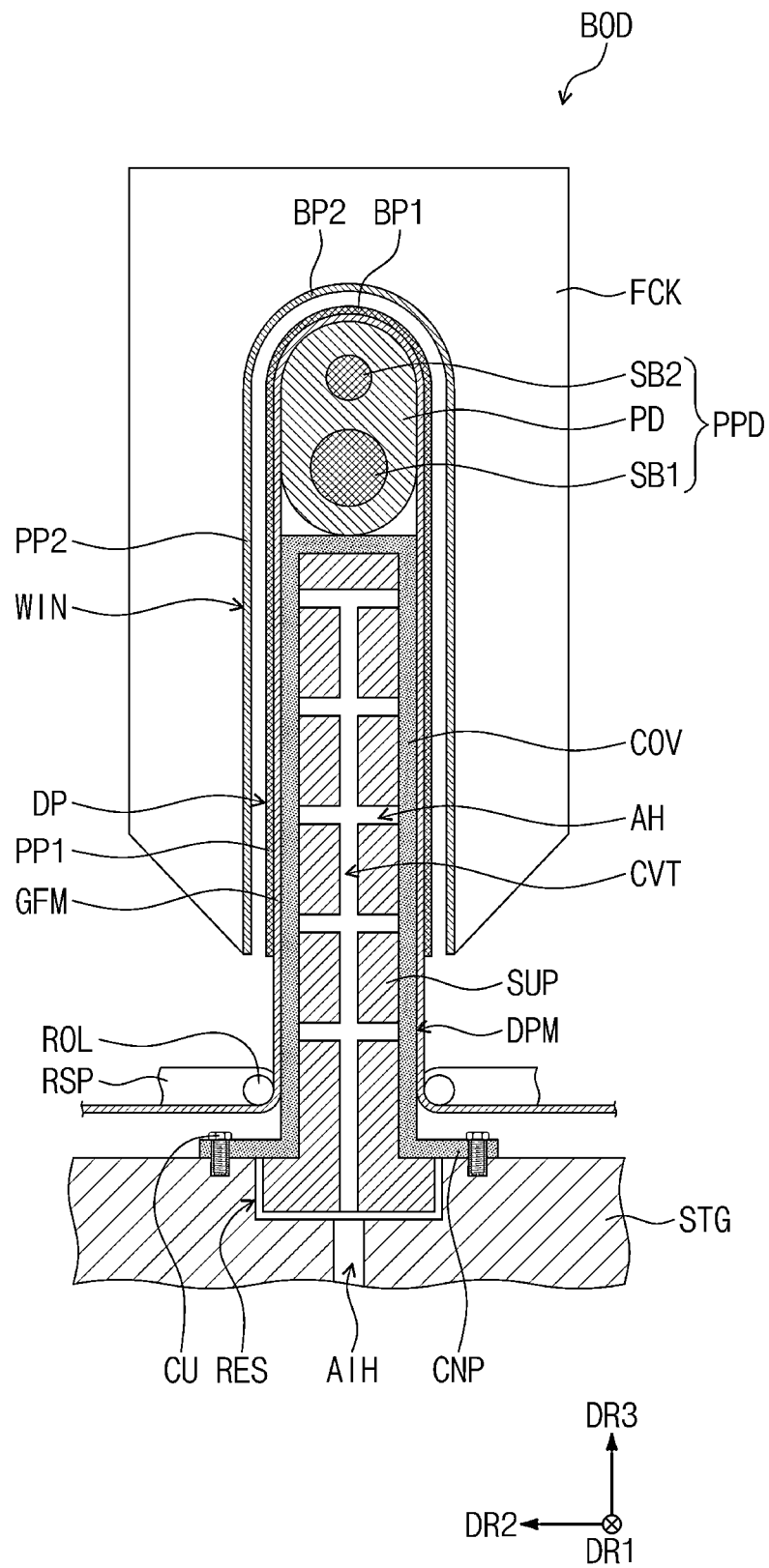

Referring to FIGS. 14 and 15A, as the support SUP, the diaphragm DPM, and the pressing pad PPD are disposed in the groove GOV, the display panel DP may be disposed in the groove GOV. The window fixing chuck FCK may move in the third direction DR3 so that the support SUP, the diaphragm DPM, and the pressing pad PPD are disposed in the groove GOV.

However, the embodiment of the inventive concept is not limited thereto. The stage STG may move in the third direction DR3 so that the support SUP, the diaphragm DPM, and the pressing pad PPD are disposed in the groove GOV. Alternatively, the window fixing chuck FCK and the stage STG may move together in the third direction DR3 to be disposed adjacent to each other.

When the diaphragm DPM and the pressing pad PPD are inserted into the groove GOV as the window fixing chuck FCK moves in the third direction DR3, the display panel DP and the window WIN may be spaced apart from each other so that the display panel DP is not bonded to the window WIN by the adhesive ADH. Thus, the display panel DP may be spaced by a predetermined distance from the window WIN in the groove GOV. For example, a distance between the display panel DP and the window WIN may be in a range from about 0.3 mm to about 0.7 mm.

Figure 15B:
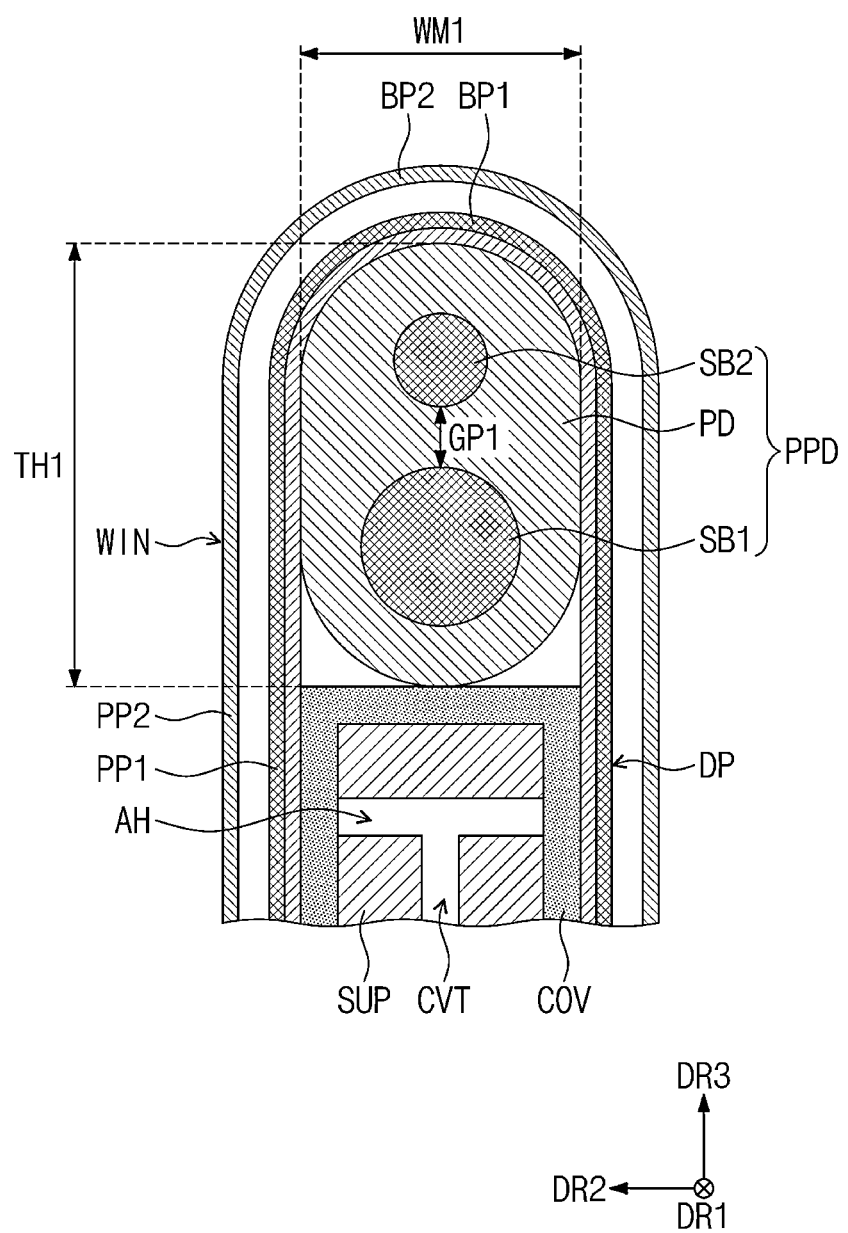

FIG. 15B is an enlarged view of the pressing pad in FIG. 15A.

Referring to FIG. 15B, the window WIN disposed in the window fixing chuck FCK in not in contact with the display panel DP. Since the window fixing chuck FCK does not press the pressing pad PPD, the pressing pad PPD may maintain an original shape thereof. In this case, the first support bar SB1 and the second support bar SB2 may be spaced a first gap GP1 from each other in the third direction DR3. The pad PD may have a first thickness TH1 in the third direction DR3. The pad PD may have a first width WM1 in the second direction DR2.

Figure 16A:
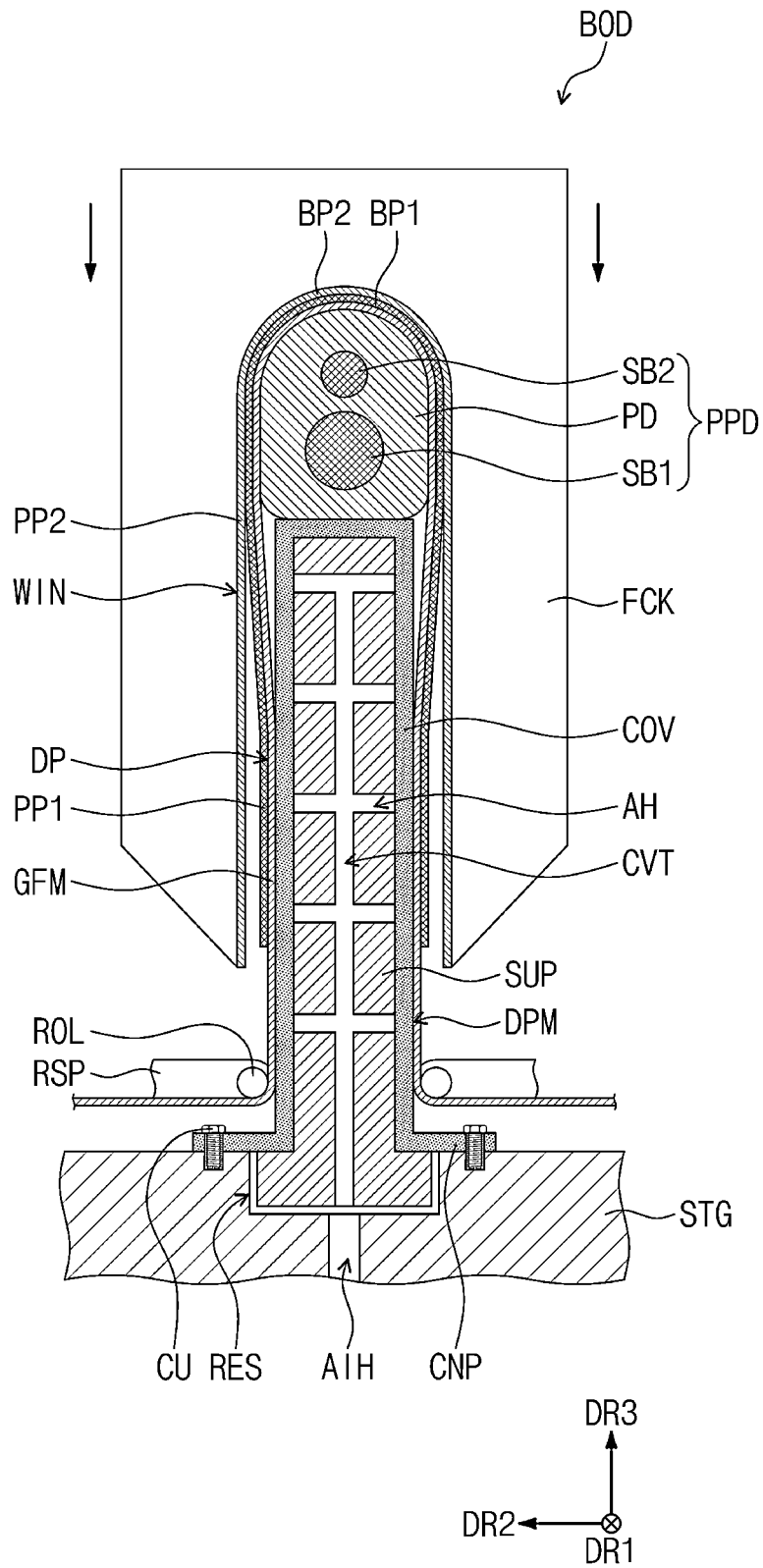

Referring to FIG. 16A, the window fixing chuck FCK may further move in the downward direction (i.e., the arrow direction) to press the pressing pad PPD. When the window fixing chuck FCK presses the pressing pad PPD, the pressing pad PPD may be deformed. Specifically, when the window fixing chuck FCK presses the pad PD, the pad PD may be deformed by a pressure caused by the window fixing chuck FCK.

The pad PD may be contracted in the third direction DR3 and expanded in the second direction DR2 by the pressure caused by the window fixing chuck FCK. The pad PD may be deformed into a shape corresponding to the concave curved surface of the window fixing chuck FCK, which defines the groove GOV. As the pad PD is contracted in the third direction DR3, the gap between the first support bar SB1 and the second support bar SB2 may decrease.

The first bent portion BP1 of the display panel DP, which is disposed on the pressing pad PPD, may be bonded to the second bent portion BP2 of the display panel DP, which is disposed adjacent to the first bent portion BP1. Specifically, when the window fixing chuck FCK presses the pad PD, as the shape of the pad PD is deformed, the first bent portion BP1 may be bonded to the second bent portion BP2 by the pressure of the pad PD.

Substantially, the first bent portion BP1 may be bonded to the second bent portion BP2 by the adhesive ADH disposed on the display panel DP.

Portions of the first flat portions PP1, which are adjacent to the first bent portion BP1, may move toward portions of the second flat portions PP2, which are adjacent to the second bent portion BP2, according to the pressure of the pad PD expanded in the second direction DR2. Thus, as the pad PD is deformed, portions of the first flat portions PP1, which are adjacent to the first bent portion BP1, may be also boned to the portions of the second flat portions PP2, which are adjacent to the second bent portion BP2.

Figure 16B:
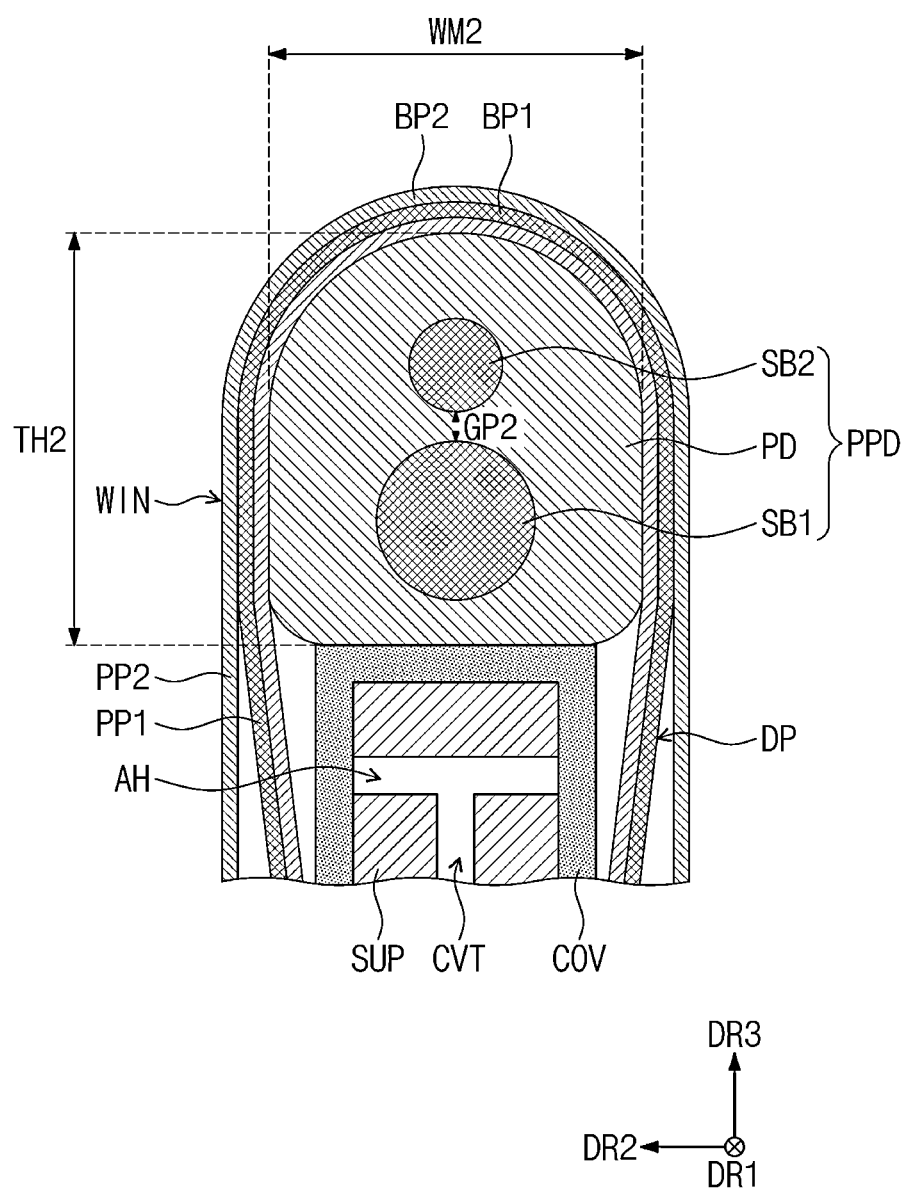

FIG. 16B is an enlarged view of the pressing pad in FIG. 16A.

Referring to FIG. 16B, as the window fixing chuck FCK presses the pressing pad PPD, the pressing pad PPD may be deformed, and the window WIN may contact the display panel DP. In this case, the first support bar SB1 and the second support bar SB2 may be spaced a second gap GP2 from each other in the third direction DR3. The second gap GP2 may be less than the first gap GP1. That is, the first support bar SB1 and the second support bar SB2 may be disposed closer than those in FIG. 15B.

When the window fixing chuck FCK presses the pressing pad PPD in a state in which the first support bar SB1 and the second support bar SB2 are fixed to the second columns COL2 as in FIG. 6, the first support bar SB1 and the second support bar SB2 in the pad PD may be bent downward.

When the window fixing chuck FCK presses the pressing pad PPD as shown in FIG. 16. A, the pad PD may have a second thickness TH2 less than the first thickness TH1 in the third direction DR3 as shown in FIG. 16B. That is, the pad PD may be contracted in the third direction DR3. The pad PD may have a second width WM2 greater than the first width WM1 in the second direction DR2. That is, the pad PD may be expanded in the second direction DR2.

As the pad PD is deformed, a portion of the diaphragm DPM, which is disposed between the pad PD and the support SUP, may be bent.

Figure 17:
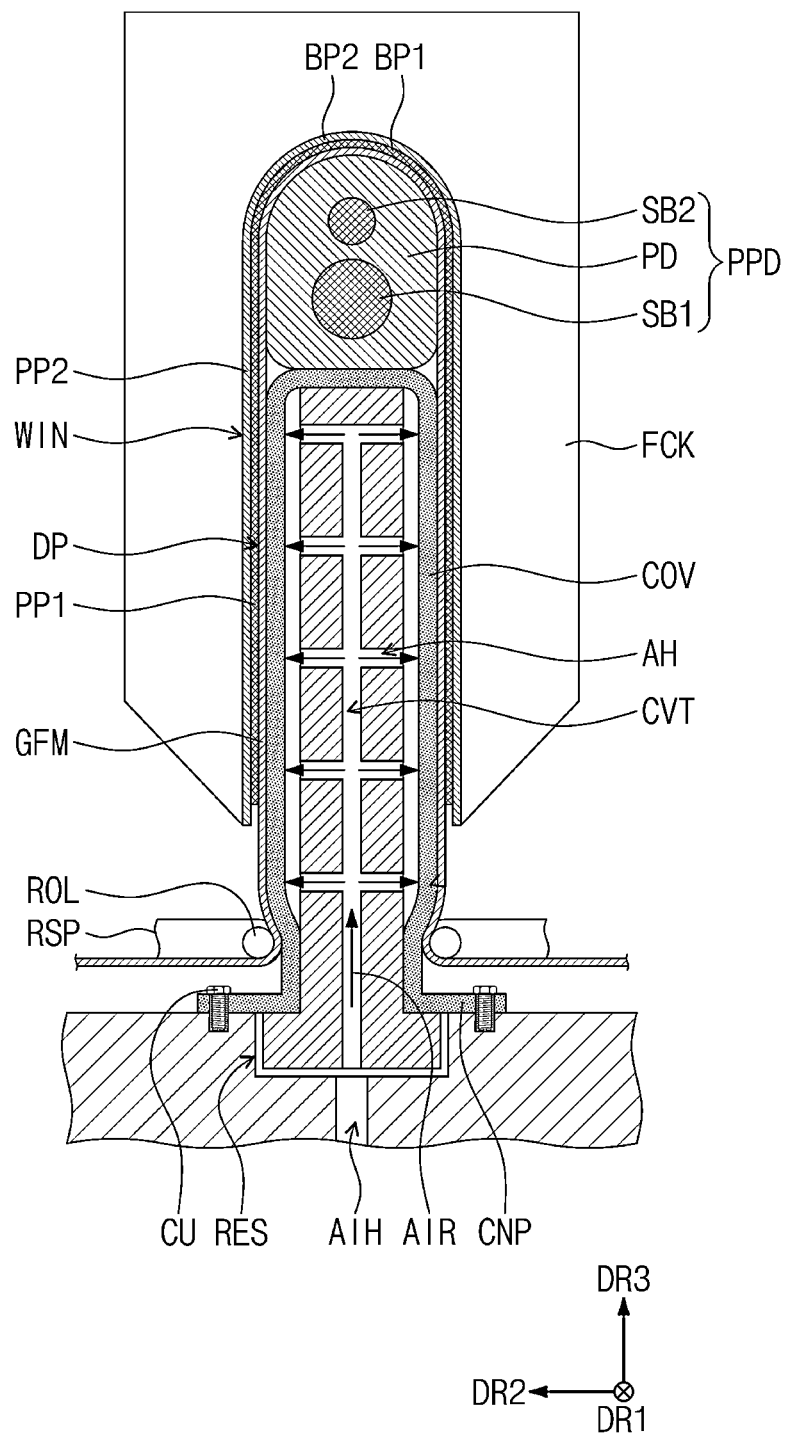

Referring to FIG. 17, the air AIR may be injected to the air injection hole AIH, and the air AIR may be supplied to the cavity CVT through the air injection hole AIH. The air AIR supplied to the cavity CVT may be supplied to the through-holes AH through the cavity CVT. The cavity CVT and the through-holes AH may define an air path through which the air AIR substantially moves. The air AIR may be supplied to the diaphragm DPM through the through-holes AH.

Although the air AIR may be exemplarily supplied to the cavity CVT and the through-hole AH through the air injection hole AIH, the embodiment of the inventive concept is not limited thereto. For example, various gases including the air or various fluids may be supplied to the cavity CVT and the through-hole AH through the air injection hole AIH.

The diaphragm DPM may be expanded toward the outside of the support SUP by the air AIR supplied through the through-hole AH. The expanded diaphragm DPM may push the first flat portions PP1 of the display panel DP to the outside of the support SUP. Here, the first flat portions PP1 may be disposed adjacent to the side surfaces of the diaphragm DPM. As a result, the first flat portions PP1 may move toward the second flat portions PP2 adjacent to the first flat portions PP1 and be bonded to the second flat portions PP2.

Substantially, the first flat portions PP1 may be bonded to the second flat portions PP2 by the adhesive ADH disposed on the display panel DP.

Although not shown, the display panel DP may be bonded to the window WIN, and then the guide film GFM may be separated from the display panel DP.

The first flat portions PP1 may be firstly bonded to the second flat portions PP2 when the bent display panel DP is inserted and bonded to the bent window WIN instead of using the bonding device BOD according to an embodiment of the inventive concept. In this case, a bonding failure in which the first bent portion BP1 is not bonded to the second bent portion BP2 may occur.

However, since the display panel DP is sequentially bonded from the first bent portion BP1 to the first flat portions PP1 by the bonding device BOD in an embodiment of the inventive concept, the display panel DP may be further easily bonded to the window WIN. Thus, the bonding failure between the display panel DP and the window WIN may be effectively prevented.

The process of bonding the first and second bent portions BP1 and BP2 each having a semi-circular shape as each of the flat display panel DP and the flat window WIN is bent at about 180 degrees (°) according to the structure of each of the pressing pad PPD, the support SUP, and the window fixing chuck FCK. The state bent by about 180° in case of the flat display panel DP represents a structure in which one first flat portion PP1 of the first flat portions PP1 moves by about 180° with respect to the first bent portion BP1 to face the other first flat portion PP1 and extend in the third direction DR3.

However, the embodiment of the inventive concept is not limited thereto. The bonding device BOD may be used to bond the display panel DP and the window WIN each having various curved surfaces. In another embodiment, for example, the display panel DP and the window WIN may be bent in a range from about 90° to about 180° and bonded to each other by changing a shape of the groove GOV defined in the window fixing chuck FCK and a shape of each of the pressing pad PPD and the support SUP. That is, the first and second bent portions BP1 and BP2 may be molded to have various curved shapes.

Figure 18:
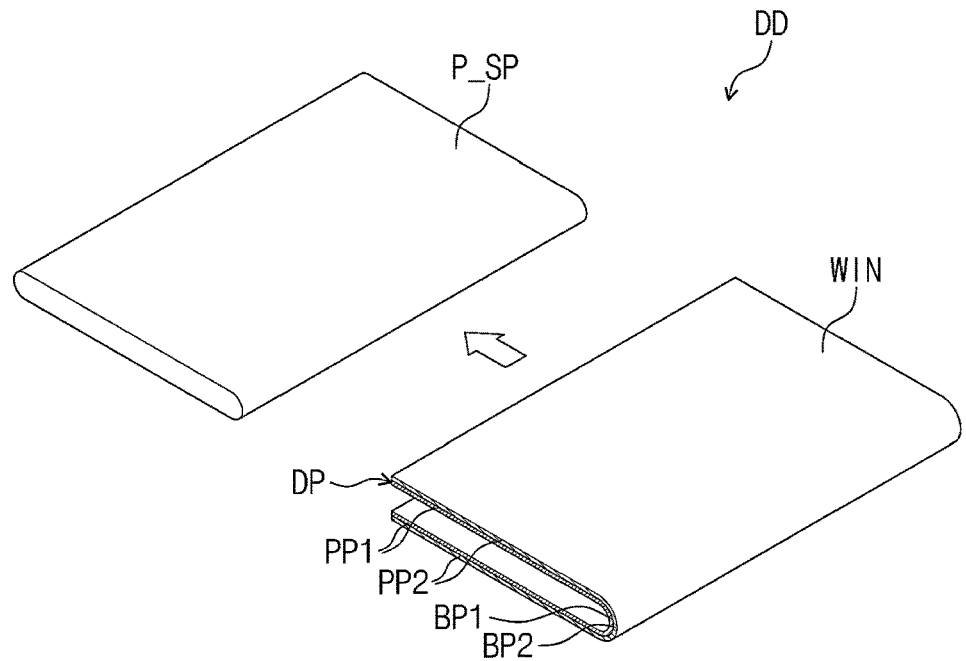
FIG. 18 is a view illustrating a panel support to be coupled with a display panel and a window.
Figure 19:
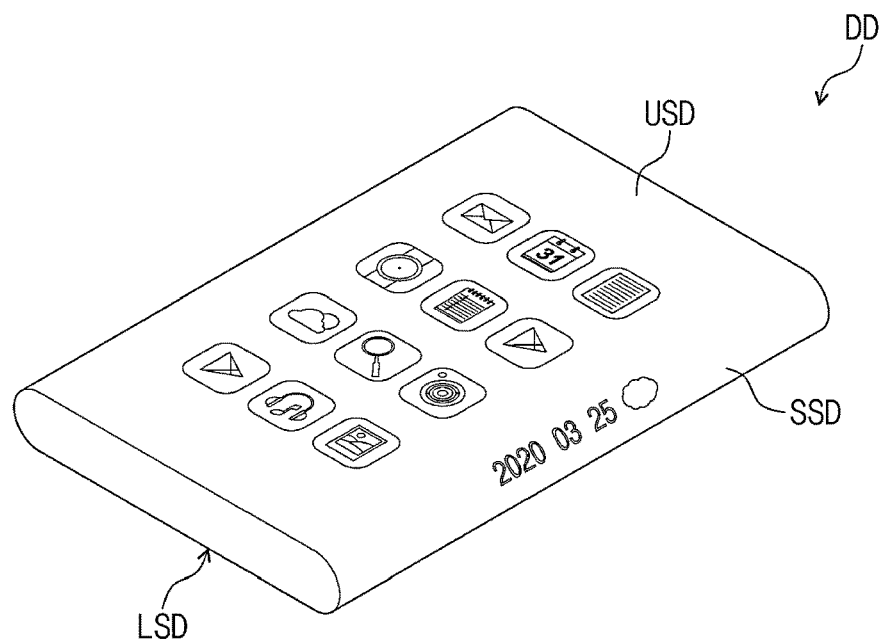
FIG. 19 is a view illustrating a display device manufactured by the display panel, the window, and the panel support, which are coupled to each other.

FIG. 18 is a view illustrating a panel support to be coupled with the display panel and the window. FIG. 19 is a view illustrating a display device manufactured by the display panel, the window, and the panel support, which are coupled to each other;

Referring to FIG. 18, the display panel DP and the window WIN, which have the bent structure and are bonded to each other, may be coupled to a panel support P_SP. The panel support P_SP may be disposed between the first flat portions PP1 of the display panel DP. The panel support P_SP may include a bracket for supporting the display panel DP, a battery for supplying a power to the display panel DP, and a system board for controlling an operation of the display panel DP.

Referring to FIGS. 18 and 19, the first bent portion BP1 of the display panel DP may define a side display part SSD of a display device DD. The first flat portions PP1 of the display panel DP may define a front display part USD and a rear display part LSD of the display device DD.

Each of the front display part USD, the rear display part LSD, and the side display part SSD may display a predetermined image. For example, the front display part USD may display predetermined icons, and the side display part SSD may display a date and weather. However, this is merely illustrative. For example, each of the front display part USD and the side display part SSD may display various images. Although not shown in terms of the perspective view, the rear display part LSD may also display various images.

Hereinafter, various embodiments of the pressing pad PPD will be described. Also, features of the pressing pad according to various embodiments, which are different from the above-described pressing pad PPD, will be mainly described, and the same components are indicated by the same reference numerals.

Figure 20:
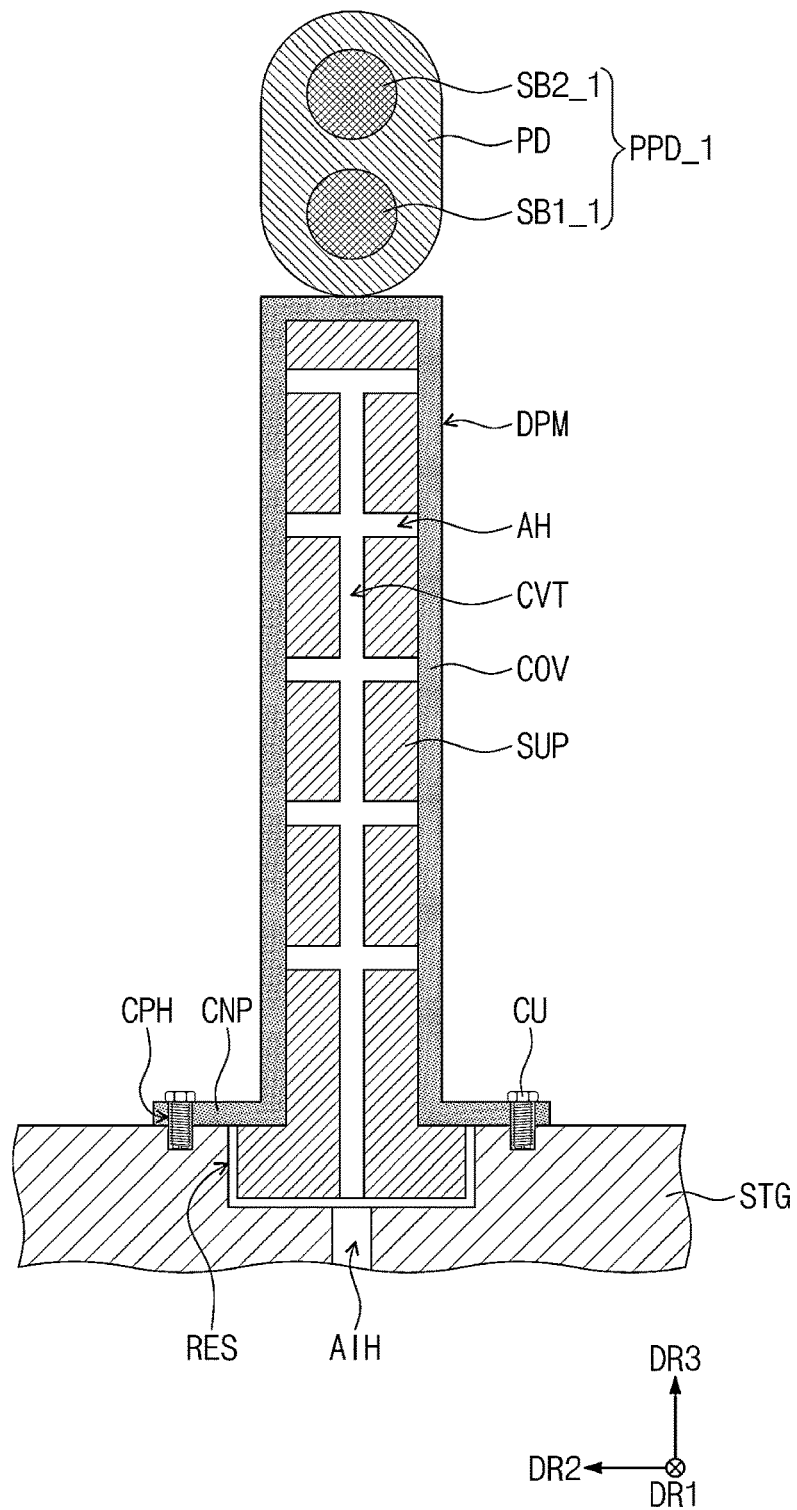
FIGS. 20 to 22 are views illustrating pressing pads according to various embodiments of the inventive concept.
Figure 21:
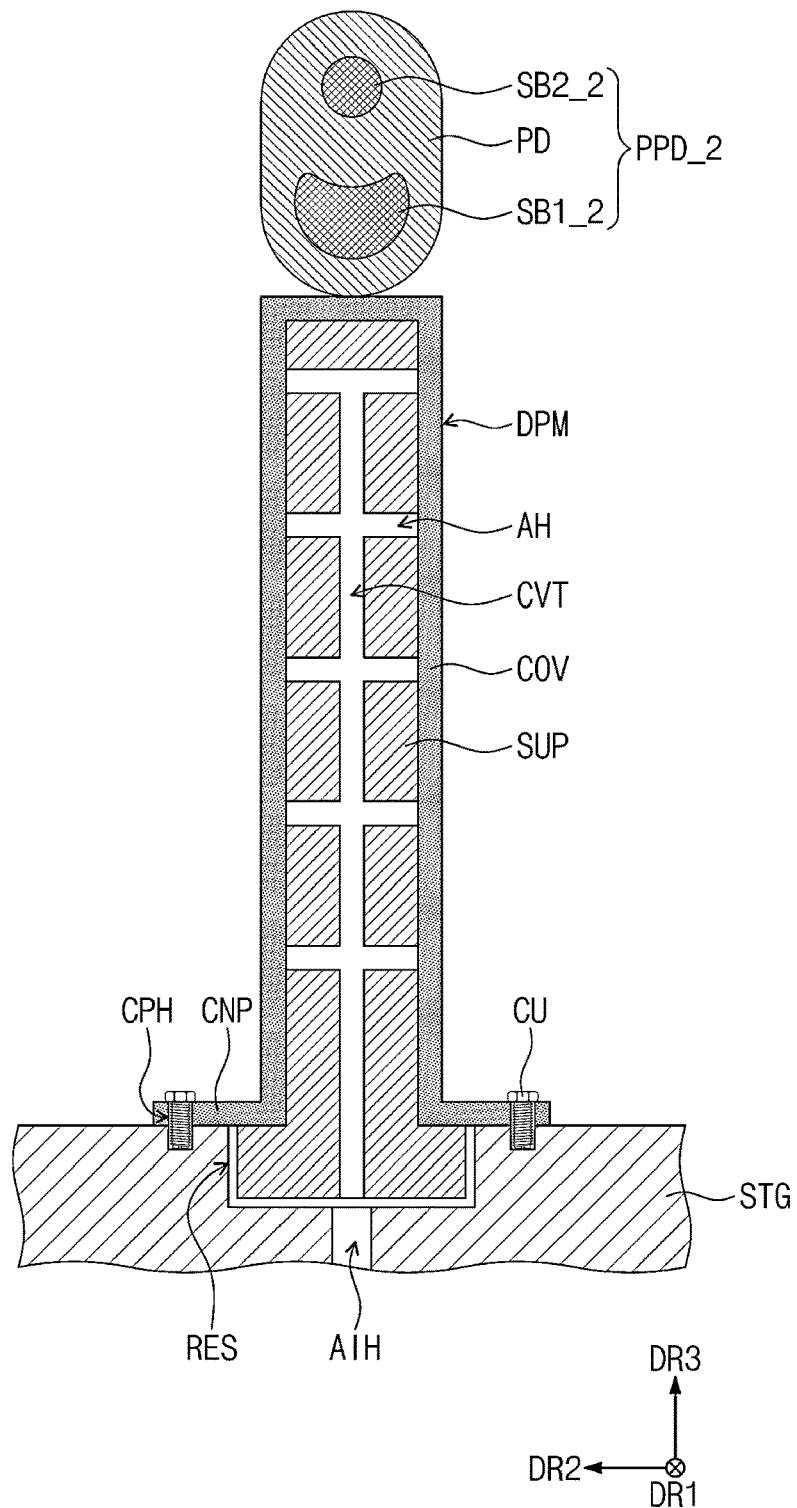
Figure 22:
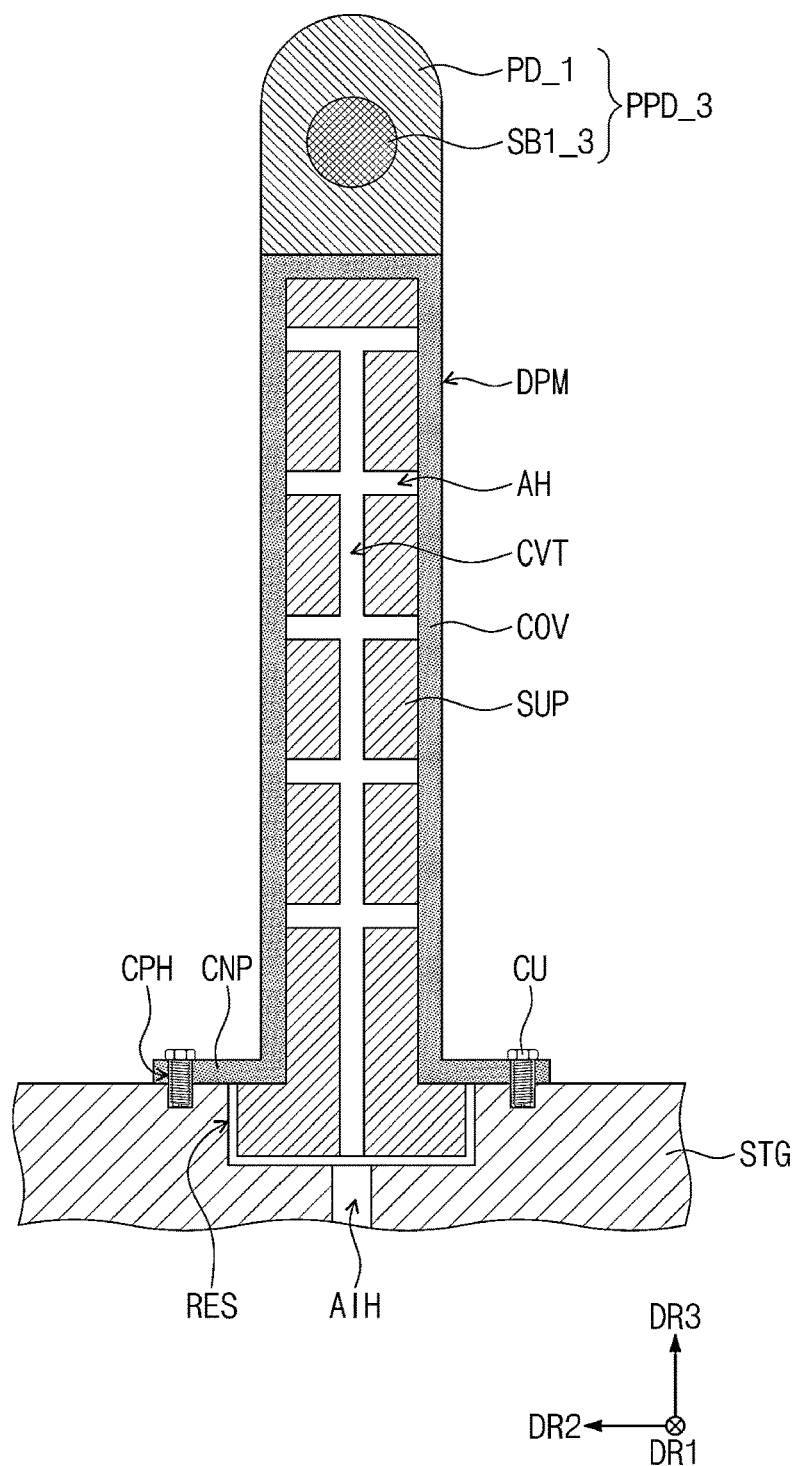

FIGS. 20 to 22 are views illustrating pressing pads according to various embodiments of the inventive concept.

In an embodiment, for example, FIGS. 20 to 22 illustrate cross-sections corresponding to FIG. 7. Thus, cross-sections of pressing pads PPD_1, PPD_2, and PPD_3 are illustrated in FIGS. 20 to 22.

Referring to FIG. 20, the pressing pad PPD_1 may be disposed on a support SUP and a diaphragm DPM and include a pad PD and a plurality of support bars SB1_1 and SB2_1 disposed in the pad PD and extending in the first direction DR1. The support bars SB1_1 and SB2_1 may include a first support bar SB1_1 extending in the first direction DR1 and a second support bar SB2_1 extending in the first direction DR1 and disposed on the first support bar SB1_1.

Each of the first and second support bars SB1_1 and SB2_1 may have a cylindrical shape extending in the first direction DR1. When viewed in the first direction DR1, a cross-section of the first support bar SB1_1 may have the same size as a cross-section of the second support bar SB2.

Referring to FIG. 21, the pressing pad PPD_2 may include a pad PD and a plurality of support bars SB1_2 and SB2_2 disposed in the pad PD and extending in the first direction DR1. The support bars SB1_2 and SB2_2 may include a first support bar SB1_2 extending in the first direction DR1 and a second support bar SB2_2 extending in the first direction DR1 and disposed on the first support bar SB1_2. The first support bar SB1_2 may have a cylindrical shape extending in the first direction DR1.

When viewed in the first direction DR1, a cross-section of the first support bar SB1_2 may have a different size from that of the cross-section of the second support bar SB2_2. For example, the cross-section of the first support bar SB1_2 may have a size greater than that of the cross-section of the second support bar SB2_2. When viewed in the first direction DR1, the first support bar SB1_2 may have a different shape (e.g., crescent shape) from the second support bar SB2_2.

Referring to FIG. 22, the pressing pad PPD_3 may include a pad PD_1 and a support bars SB1_3 disposed in the pad PD_1 and extending in the first direction DR1. The pressing pad PPD_3 may include the single support bar SB1_3 unlike the previous embodiments. The support bar SB1_3 may have a cylindrical shape extending in the first direction DR1. A top surface of the pad PD_1 may have a convex curved surface. A bottom surface of the pad PD_1 may have a flat surface.

According to the embodiment of the inventive concept, the first bent portion of the display panel may be bonded to the second bent portion of the window, which is adjacent to the first bent portion, and then the first flat portion of the display panel may be bonded to the second flat portion of the window, which is adjacent to the first flat portion. Thus, the bonding defect generated between the first bent portion and the second bent portion may be effectively prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a display device, the method comprising:
    preparing a diaphragm disposed on a support to cover the support and a pressing pad disposed on the diaphragm over a top surface of the support;
    arranging a display panel on side surfaces of the diaphragm and the pressing pad, wherein the side surfaces of the diaphragm are adjacent to side surfaces of the support;
    arranging a window in a groove of a window fixing chuck disposed above the pressing pad;
    arranging the diaphragm and the pressing pad in the groove;
    bonding a first bent portion of the display panel to a second bent portion of the window, which is adjacent to the first bent portion, by moving the window fixing chuck in a direction toward the pressing pad to press the pressing pad, wherein the first bent portion is disposed on the pressing pad; and
    bonding first flat portions of the display panel to second flat portions of the window by expanding the diaphragm, wherein each of the first flat portions extends from the first bent portion in a direction the window fixing chuck moves and is adjacent to the side surface of the diaphragm, and the second flat portions are adjacent to the first flat portions.

2. The method of claim 1, wherein the diaphragm is expanded by air injected through through-holes defined in the support.

3. The method of claim 2, wherein at least one cavity is defined in the support, and the through-holes each extend from the at least one cavity.

4. The method of claim 1, wherein the pressing pad comprises:
    a pad; and
    at least one support bar disposed in the pad and extending in a first direction.

5. The method of claim 4, wherein the pad is deformable by a pressure caused by the window fixing chuck when the window fixing chuck moves in the direction toward the pressing pad.

6. The method of claim 4, wherein the pad has elasticity and is deformable by an external force.

7. The method of claim 4, wherein the at least one support bar has rigidity greater than rigidity of the pad.

8. The method of claim 4, wherein the pad extends in the first direction, and a top surface of the pad has a curved surface convex in a direction to the groove when viewed in the first direction.

9. The method of claim 8, wherein the groove extends in the first direction, and the window fixing chuck has a concave curved surface at an inner end of the groove, and the concave curved surface faces the curved surface of the pad.

10. The bonding device method of claim 1, wherein the support and the diaphragm are disposed on a stage, and the diaphragm covers the support and is connected to the stage.

11. The bonding device method of claim 10, wherein the diaphragm comprises:
    a cover portion covering the support; and
    a connection portion extending from a lower end of the cover portion in parallel to the stage and connected to the stage.

12. The bonding device method of claim 4, wherein the at least one support bar comprises:
   a first support bar extending in the first direction; and
   a second support bar extending in the first direction and disposed over the first support bar.

13. The bonding device method of claim 12, wherein when viewed in the first direction, a cross-section of the first support bar has a size different from a size of a cross-section of the second support bar.

14. The bonding device method of claim 12, wherein when viewed in the first direction, a cross-section of the first support bar has a same size as a cross-section of the second support bar.

15. The bending device method of claim 12, wherein when viewed in the first direction, the first support bar has a shape different from a shape of the second support bar.

* * * * *